United States Patent
Kim et al.

(10) Patent No.: US 8,766,356 B2
(45) Date of Patent: *Jul. 1, 2014

(54) SEMICONDUCTOR DEVICES HAVING BIT LINE INSULATING CAPPING PATTERNS AND MULTIPLE CONDUCTIVE PATTERNS THEREON

(71) Applicant: Samsung Electronics Co., Ltd., Suwon-si (KR)

(72) Inventors: Dae-lk Kim, Hwaseong-si (KR); Yong-Il Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/900,910

(22) Filed: May 23, 2013

(65) Prior Publication Data

US 2013/0256793 A1    Oct. 3, 2013

Related U.S. Application Data

(63) Continuation of application No. 13/241,716, filed on Sep. 23, 2011, now Pat. No. 8,450,786, which is a continuation of application No. 12/232,498, filed on Sep. 18, 2008, now Pat. No. 8,063,425.

(30) Foreign Application Priority Data

Sep. 18, 2007    (KR) .................. 10-2007-0094725
Aug. 26, 2008    (KR) .................. 10-2008-0083457

(51) Int. Cl.
*H01L 27/088*    (2006.01)

(52) U.S. Cl.
USPC ........................................ 257/334

(58) Field of Classification Search
CPC ............... H01L 29/7813; H01L 29/42638; H01L 29/407; H01L 29/41766; H01L 29/4236
USPC ................... 257/298, 306, 334, E27.084
See application file for complete search history.

(56) References Cited

U.S. PATENT DOCUMENTS

| | | | |
|---|---|---|---|
| 5,502,320 | A | 3/1996 | Yamada |
| 5,631,188 | A | 5/1997 | Chang et al. |

(Continued)

FOREIGN PATENT DOCUMENTS

| | | |
|---|---|---|
| JP | 10-098167 | 4/1998 |
| JP | 10-242422 | 9/1998 |

(Continued)

OTHER PUBLICATIONS

Korean Office Action (5 pages) corresponding to Korean Patent Application No. 10-2008-0083457; Issue Date: Jan. 14, 2014.

*Primary Examiner* — Matthew W Such
*Assistant Examiner* — Monica D Harrison
(74) *Attorney, Agent, or Firm* — Myers Bigel Sibley & Sajovec, P.A.

(57) ABSTRACT

A semiconductor device capable of reducing a thickness, an electronic product employing the same, and a method of fabricating the same are provided. The method of fabricating a semiconductor device includes preparing a semiconductor substrate having first and second active regions. A first transistor in the first active region includes a first gate pattern and first impurity regions. A second transistor the second active region includes a second gate pattern and second impurity regions. A first conductive pattern is on the first transistor, wherein at least a part of the first conductive pattern is disposed at a same distance from an upper surface of the semiconductor substrate as at least a part of the second gate pattern. The first conductive pattern may be formed on the first transistor while the second transistor is formed.

20 Claims, 21 Drawing Sheets

(56) References Cited

U.S. PATENT DOCUMENTS

| | | | |
|---|---|---|---|
| 5,686,329 A | 11/1997 | Chang et al. | |
| 6,022,794 A | 2/2000 | Hsu | |
| 6,281,540 B1 | 8/2001 | Aoki | |
| 6,326,657 B1 | 12/2001 | Ohkawa | |
| 6,429,068 B1 | 8/2002 | Divakaruni et al. | |
| 6,440,783 B2 | 8/2002 | Wong | |
| 6,448,610 B2 | 9/2002 | Weis | |
| 6,528,835 B1 | 3/2003 | Kaeriyama | |
| 6,828,624 B1 | 12/2004 | Goda et al. | |
| 6,900,492 B2 | 5/2005 | Takaura et al. | |
| 6,987,041 B2 | 1/2006 | Ohkawa | |
| 7,034,408 B1 | 4/2006 | Schloesser | |
| 7,129,541 B2 | 10/2006 | Kim et al. | |
| 7,429,507 B2 | 9/2008 | Ohkawa | |
| 7,595,262 B2 | 9/2009 | Schloesser | |
| 7,728,373 B2 | 6/2010 | Seo et al. | |
| 8,168,492 B2 | 5/2012 | Kim et al. | |
| 8,450,786 B2 * | 5/2013 | Kim et al. | 257/306 |
| 2001/0025973 A1 | 10/2001 | Yamada et al. | |
| 2004/0104416 A1 | 6/2004 | Takaura et al. | |
| 2005/0208716 A1 | 9/2005 | Takaura et al. | |
| 2006/0192249 A1 | 8/2006 | Kim et al. | |
| 2006/0284232 A1 | 12/2006 | Hong et al. | |
| 2007/0004119 A1 | 1/2007 | Chun | |
| 2007/0045712 A1 | 3/2007 | Haller et al. | |
| 2007/0278586 A1 | 12/2007 | Chen et al. | |
| 2008/0048333 A1 | 2/2008 | Seo et al. | |
| 2008/0111155 A1 | 5/2008 | Capasso et al. | |
| 2008/0265332 A1 | 10/2008 | Moriwaki | |
| 2010/0193880 A1 | 8/2010 | Yoshida et al. | |
| 2011/0020993 A1 | 1/2011 | Park et al. | |

FOREIGN PATENT DOCUMENTS

| | | |
|---|---|---|
| JP | 2001-068643 | 3/2001 |
| JP | 2003-031684 A | 1/2003 |
| JP | 2004-534403 | 11/2004 |
| JP | 07-066297 | 3/2005 |
| JP | 2005-072617 A | 3/2005 |
| JP | 2006-295180 A | 10/2006 |
| JP | 2008-113005 A | 5/2008 |
| KR | 10-2001-0005233 | 1/2001 |
| KR | 10-2001-0088445 | 9/2001 |
| KR | 1020030006982 | 1/2003 |
| KR | 10-2004-0012972 | 2/2004 |
| KR | 10-2006-0038609 | 5/2006 |
| KR | 10-2006-0131516 | 12/2006 |
| KR | 10-2007-0001588 | 1/2007 |
| KR | 10-2009-0029637 | 3/2009 |

* cited by examiner

SEMICONDUCTOR DEVICES HAVING BIT LINE INSULATING CAPPING PATTERNS AND MULTIPLE CONDUCTIVE PATTERNS THEREON

RELATED APPLICATIONS

This application claims the benefit of priority as a continuation of U.S. application Ser. No. 13/241,716 filed Sep. 23, 2011, which claims the benefit of priority as a continuation of U.S. application Ser. No. 12/232,498 filed Sep. 18, 2008, now U.S. Pat. No. 8,063,425, which claims the benefit of priority to Korean Application No. 10-2007-0094725 filed Sep. 18, 2007, and to Korean Application No. 10-2008-0083457 filed Aug. 26, 2008. The disclosures of all of the above referenced applications are hereby incorporated herein in their entireties by reference.

BACKGROUND OF THE INVENTION

1. Field of the Invention

Example embodiments relate to a semiconductor device, to an electronic product employing the same, and to methods of fabricating the same. More particularly, example embodiments relate to a semiconductor device having a reduced thickness, an electronic product employing the same, and methods of fabricating the same.

2. Description of the Related Art

Lately, to meet a demand for smaller semiconductor chips that are used for electronic products and require lower power consumption, research into reducing the size of an element constituting the semiconductor chips is being progressively carried out.

SUMMARY OF THE INVENTION

Embodiments are therefore directed to a semiconductor device, an electronic product employing the same, and to methods of fabricating the same, which substantially overcome one or more of the disadvantages of the related art.

It is therefore a feature of an example embodiment to provide a semiconductor device structure having a reduced thickness.

It is another feature of an example embodiment to provide an electronic product including a semiconductor device structure having a reduced thickness.

It is yet another feature of an example embodiment to provide a method of fabricating a semiconductor device having a reduced thickness.

At least one of the above and other features and advantages may be realized by providing a semiconductor device, including a semiconductor substrate having first and second active regions. A first transistor in the first active region of the semiconductor substrate is provided. The first transistor includes first impurity regions and a first gate pattern. A second transistor in the second active region of the semiconductor substrate is provided. The second transistor includes second impurity regions and a second gate pattern. A first conductive pattern is formed on the first transistor. At least a part of the first conductive pattern is disposed at a same distance above an upper surface of the semiconductor substrate as at least a part of the second gate pattern.

The first transistor may include the conductive first gate pattern provided in a gate trench crossing the first active region, the first impurity regions provided in the first active region at both sides of the first gate pattern, and a first gate dielectric layer provided between the first gate pattern and the gate trench.

An insulating first gate capping pattern filling the gate trench together with the first gate pattern may be further included. The first gate capping pattern may have a projection higher than the first active region above the upper surface of the substrate.

A first contact structure configured to electrically connect one of the first impurity regions to the first conductive pattern may be further included.

The second transistor may include the second gate pattern crossing the second active region, a second gate dielectric layer provided between the second gate pattern and the active region, and second impurity regions provided in the second active region at both sides of the second gate pattern. Here, the second gate pattern may include a first gate electrode and a second gate electrode, which are sequentially stacked, and the second gate electrode may be disposed at the substantially same level as the first conductive pattern.

The semiconductor device may further include a cell contact structure electrically connected to one of the first impurity regions, and a data storage element provided on the cell contact structure.

The data storage element may be disposed at a higher level than the first conductive pattern.

A conductive buffer pattern provided between the cell contact structure and the data storage element may be further included.

The data storage element may include one of a data storage material layer of a volatile memory device, and a data storage material layer of a non-volatile memory device.

A second conductive pattern disposed at a higher level than the first conductive pattern, and a second contact structure configured to electrically connect one of the second impurity regions to the second conductive pattern may be further included.

The cell contact structure and the second contact structure may have upper surfaces disposed at different levels. Alternatively, the cell contact structure and the second contact structure may have upper surfaces disposed at the substantially same level.

A connection structure configured to electrically connect the first and second conductive patterns may be further included.

According to another example embodiment, an electronic product including a semiconductor chip is provided. The semiconductor chip of the electronic product includes a semiconductor substrate having a cell array region and a peripheral circuit region. A cell transistor on the semiconductor substrate of the cell array region, and including first impurity regions and a first gate pattern may be provided. A peripheral transistor on the semiconductor substrate of the peripheral circuit region, and including second impurity regions, and a first peripheral gate electrode and a second peripheral gate electrode, which are sequentially stacked on the substrate between the second impurity regions, is provided. A cell bit line on the cell transistor of the cell array region, and having at least a part at a same distance from an upper surface of the semiconductor substrate as at least a part of the second peripheral gate electrode may be provided.

According to still another example embodiment, a method of fabricating a semiconductor device capable of having a reduced thickness is provided. The method includes preparing a semiconductor substrate having first and second active regions, forming a first transistor the first active region including a first gate pattern and first impurity regions, forming, in the second active region, a second transistor including a second gate pattern and second impurity regions, and forming a first conductive pattern on the first transistor. At least a part of the first conductive pattern is disposed at a same distance from an upper surface of the semiconductor substrate as at least a part of the second gate pattern. The first conductive pattern may be formed while the second transistor is formed.

Forming the first and second transistors and the first conductive pattern may include forming the first impurity regions in the first active region, forming a gate trench crossing the first active region, forming the first gate pattern filling at least a part of the gate trench, forming a gate conductive pattern in the second active region, forming a buffer insulating pattern on the first active region, forming a first conductive layer covering the buffer insulating pattern and the gate conductive pattern, and patterning the first conductive layer on the buffer insulating pattern, and the gate conductive pattern and the first conductive layer, which are sequentially stacked on the second active region so that the first conductive pattern may be formed on the buffer insulating pattern, and a first gate electrode and a second gate electrode, which are sequentially stacked, may be formed on the second active region.

After forming the first gate pattern, forming a first gate capping pattern to fill the gate trench together with the first gate pattern on the first gate pattern may be further included. The first gate capping pattern may have a projection at a higher level than the first active region.

The buffer insulating pattern may be formed after the gate conductive pattern is formed. Alternatively, the gate conductive pattern may be formed after the buffer insulating pattern is formed.

Before forming the first conductive pattern, forming a first contact structure configured to pass through the buffer insulating pattern, and electrically connected to one of the first impurity regions may be further included. The first conductive structure may be electrically connected to the first conductive pattern.

Forming a first interlayer insulating layer on the substrate having the first conductive pattern, forming a cell contact structure configured to pass through the first interlayer insulating layer, and electrically connected to one of the first impurity regions, and forming a data storage element on the cell contact structure may be further included.

While forming the cell contact structure, forming a peripheral contact structure configured to pass through the first interlayer insulating layer and electrically connected to one of the second impurity regions, and forming a second conductive pattern electrically connected to the peripheral contact structure on the first interlayer insulating layer may be further included.

While forming the second conductive pattern, forming a buffer pattern electrically connected to the cell contact structure on the first interlayer insulating layer may be further included.

Meanwhile, forming a second interlayer insulating layer on the first interlayer insulating layer, forming a second contact structure configured to pass through the first and second interlayer insulating layers, and electrically connected to one of the second impurity regions, and forming a second conductive pattern on the second interlayer insulating layer may be further included.

According to yet another example embodiment, a method of fabricating a semiconductor device is provided. The method includes preparing a semiconductor substrate having first and second regions. An insulating pattern is formed on the semiconductor substrate of the first region. A conductive pattern is formed on the semiconductor substrate of the second region. A conductive layer covering the conductive pattern and the insulating pattern is formed. The conductive layer and the conductive pattern are patterned, so that an interconnection is formed on the insulating pattern, and a first gate electrode and a second gate electrode, which are sequentially stacked, are formed on the semiconductor substrate of the second region.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
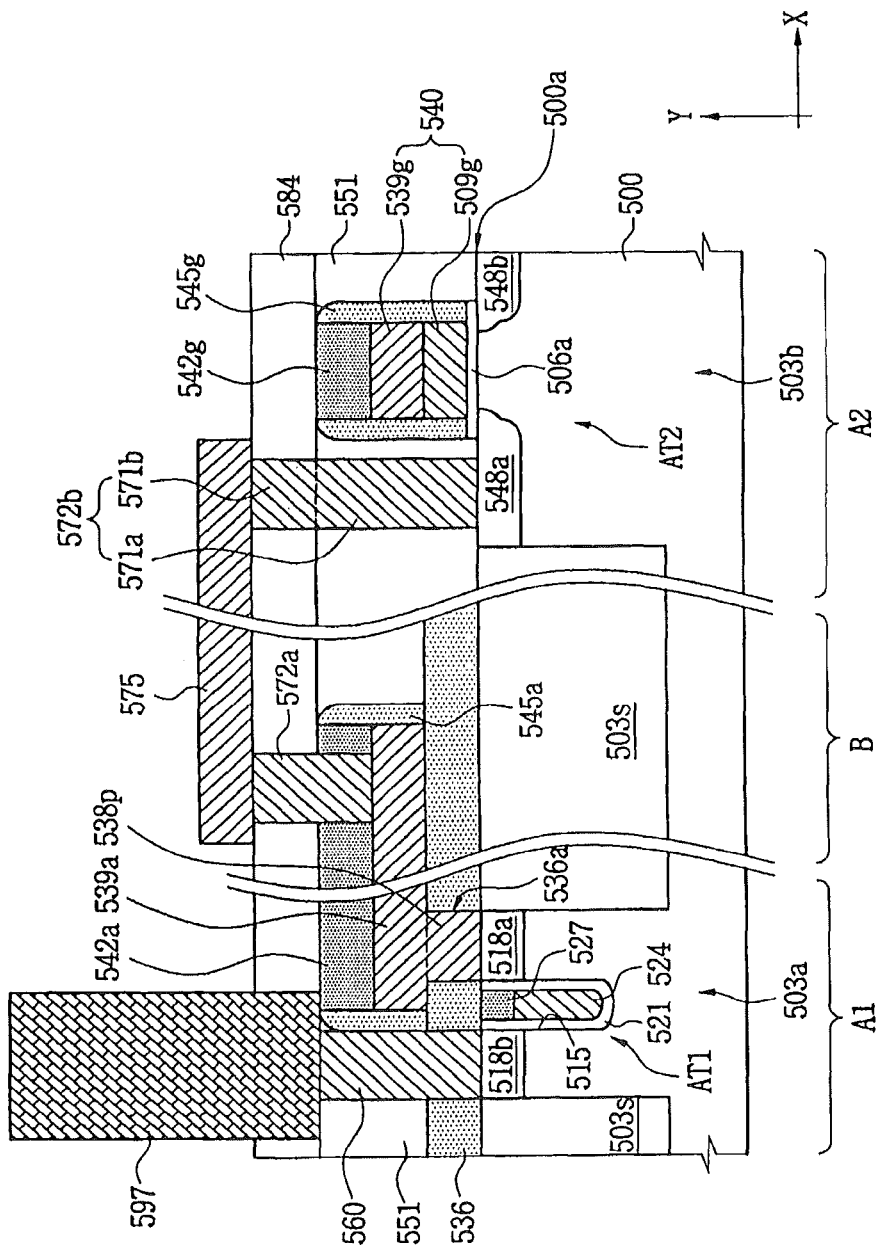
FIG. 1 illustrates a cross-sectional view of a semiconductor device according to an example embodiment.

Korean Patent Application Nos. 10-2007-0094725, filed on Sep. 18, 2007, and 10-2008-0083457, filed on Aug. 26, 2008, in the Korean Intellectual Property Office, and entitled: "Semiconductor Device Having Reduced Thickness, Electronic Product Employing the Same, and Methods of Fabricating the Same," are incorporated by reference herein in their entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

A semiconductor device according to an example will be described in more detail below with reference to FIG. 1. FIG. 1 illustrates a cross-sectional view of a semiconductor device according to an example embodiment.

Referring to FIG. 1, a semiconductor device may include a semiconductor substrate 500, first and second transistors AT1 and AT2 on the semiconductor substrate 500, and a first conductive pattern 539a positioned on the first transistor AT1 to have at least one portion at a substantially same height, e.g., above an upper surface 500a of the semiconductor substrate 500 along a first direction, i.e., the y-axis, as a portion of a second gate pattern 540 of the second transistor AT2.

The semiconductor substrate 500 may have a first region A1, a second region A2, and an intermediate region B. The semiconductor substrate 500 may be a semiconductor wafer including a semiconductor material such as silicon. The first region A1 may be a memory cell array region, and the second region A2 may be a peripheral circuit region. The intermediate region B may correspond to a predetermined region between a first device, e.g., a cell transistor, on the first region A1, and a second device, e.g., a peripheral transistor, on the second region A2. It is noted that while the intermediate region B is illustrated in FIG. 1 as an independent region between the first region A1 and the second region A2, other configurations of the intermediate region B, e.g., the intermediate region B may be disposed in a memory cell array region such as the first region A1 or may be disposed in a peripheral circuit region such as the second region A2, are within the scope of the present invention.

An isolation region 503s defining first and second active regions 503a and 503b may be provided in the semiconductor substrate 500. The isolation region 503s may be a trench isolation layer. The isolation region 503s may define the first active region 503a, e.g., a cell active region, in the first region A1, and may define the second active region 503b, e.g. a peripheral active region, in the second region A2.

The first transistor AT1 may be provided in the first active region 503a. The first transistor AT1 may include first impurity regions 518a and 518b in the first active region 503a, a first channel region between the first impurity regions 518a and 518b, a first gate dielectric layer 521, and a first gate pattern 524. The first transistor AT1 may have a recess channel, so the first gate dielectric layer 521 and first gate pattern 524 may be sequentially stacked in a gate trench 515 in the first channel region. The first gate pattern 524 may be a cell gate electrode.

More specifically, a gate trench 515 may be formed in the semiconductor substrate 500. The gate trench 515 may have a predetermined depth along a first direction, e.g., along the y-axis, from an upper surface 500a of the semiconductor substrate 500 in a downward direction, and may cross the first active region 503a. The gate trench 515 may extend toward the isolation region 503s. The first gate pattern 524 may be provided in the gate trench 515, so the first gate pattern 524 may cross the first active region 503a and extend toward the isolation region 503s.

For example, the first gate pattern 524 may partially fill the gate trench 515, so a first gate capping pattern 527 may fill a remaining portion of the gate trench 515. In other words, as illustrated in FIG. 1, the first gate pattern 524 and the first gate capping pattern 527 may be sequentially stacked on each other in the gate trench 515, so an upper surface of the first gate capping pattern 527 may be substantially level, i.e., coplanar, with the upper surface 500a of the semiconductor substrate 500. The first gate capping pattern 527 may be formed of an insulating material layer.

The first gate dielectric layer 521 may be interposed between an internal wall of the gate trench 515 and the first gate pattern 524, e.g., the first gate dielectric layer 521 may be on an entire internal wall of the gate trench 515. The first impurity regions 518a and 518b may be provided in upper regions of the first active region 503a, i.e., upper surfaces of the first impurity regions 518a and 518b may be substantially level with the upper surface 500a of the semiconductor substrate 500, at both sides of the gate trench 515, i.e., the first gate capping pattern 527 in the gate trench 515 may be between the first impurity regions 518a and 518b.

The second transistor AT2 may be provided in the second active region 503b. The second transistor AT2 may include second impurity regions 548a and 548b in the second active region 503b, a second channel region between the second impurity regions 548a and 548b, a second gate dielectric layer 506a, and a second gate pattern 540. The second gate dielectric layer 506a and second gate pattern 540 may be sequentially stacked on the second channel region. The second gate pattern 540 may include a lower gate electrode 509g and an upper gate electrode 539g, which may be sequentially stacked. An insulation second gate capping pattern 542g may be provided on the second gate pattern 540.

The lower gate electrode 509g and the upper gate electrode 539g may be formed of a substantially same material or of different materials. For example, the upper gate electrode 539g may be formed of a conductive material having a higher conductivity than the lower gate electrode 509g, e.g., the lower gate electrode 509g may include a doped polysilicon layer and the upper gate electrode 539g may include a metal material layer such as a tungsten layer. Taking into account ohmic contact characteristics between a polysilicon layer and a metal material layer, a metal silicide layer may be interposed between the upper gate electrode 539g and the lower gate electrode 509g. In another example, the upper gate electrode 539g and the lower gate electrode 509g may be formed of a substantially same conductive material.

The first conductive pattern 539a may be provided on the first transistor AT1 with a buffer insulating pattern 536 therebetween. The buffer insulating pattern 536 may be provided on the first region A1 and intermediate region B of the semiconductor substrate 500 to cover the first transistor AT1 and the first gate capping pattern 527. The first conductive pattern 539a may be a linear structure, e.g., a shape of a line, provided on the buffer insulating pattern 536. The first conductive pattern 539a may be defined as a cell bit line. At least a part of the first conductive pattern 539a may be disposed at a substantially same height along the first direction, e.g., the y-axis, as at least a part of the second gate pattern 540. For example, at least a part of the first conductive pattern 539a may be disposed at a substantially same level, i.e., height along the y-axis above the upper surface 500a of the semiconductor substrate 500, as at least a part of the upper gate electrode 539g. In another example, a lower surface of the first conductive pattern 539a may be substantially coplanar along the xz-plane with a lower surface of the upper gate electrode 539g, so distance from each of the lower surfaces of the first conductive pattern 539a and the upper gate electrode 539g to, e.g., the upper surface 500a of the semiconductor substrate 500, may be substantially equal. The first conductive pattern 539a may include a substantially same conductive material and may be formed by a substantially same process as the upper gate electrode 539g.

A first contact structure 538p may electrically connect one region 518a of the first impurity regions 518a and 518b to the first conductive pattern 539a. The first contact structure 538p may pass through the buffer insulating pattern 536.

A first insulating capping pattern 542a may be provided on the first conductive pattern 539a. A first insulating spacer 545a may be provided on sidewalls of the first conductive pattern 539a and the first insulating capping pattern 542a. A second insulating spacer 545g may be provided on sidewalls of the second gate pattern 540 and the second gate capping pattern 542b. The first and second insulating spacers 545a and 545g may include a substantially same insulating material layer formed by the same process.

A first interlayer insulating layer 551 covering the entire surfaces of the first and second regions A1 and A2 and the intermediate region B of the semiconductor substrate 500 may be provided. The first interlayer insulating layer 551 may have a planarized upper surface disposed at a higher level along the first direction, e.g., the y-axis, than upper surfaces of the first insulating capping pattern 542a and the second gate capping pattern 542g. Alternatively, the first interlayer insulating layer 551 may have a planarized upper surface disposed at a substantially same level as upper surfaces of the first insulating capping pattern 542a and the second gate capping pattern 542g, as illustrated in FIG. 1. A second interlayer insulating layer 584 may be provided on the first interlayer insulating layer 551.

A second conductive pattern 575 may be provided on the second interlayer insulating layer 584. The second conductive pattern 575 may be electrically connected to the first conductive patterns 539a via a conductive connection structure 572a. The connection structure 572a may be interposed between the first and second conductive patterns 539a and 575, and may sequentially pass through the second interlayer insulating layer 584 and the first insulating capping pattern 542a, as illustrated in FIG. 1.

A second contact structure 572b interposed between one region 548a of the second impurity regions 548a and 548b and the second conductive pattern 575 may electrically connect the region 548a of the second transistor AT2 to the second conductive pattern 575. The second contact structure 572b may include a lower contact structure 571a passing through the first interlayer insulating layer 551, and an upper contact structure 571b passing through the second interlayer insulating layer 584. The lower contact structure 571a and the upper contact structure 571b may be formed of conductive material layers formed by different processes from each other. Alternatively, the lower contact structure 571a and the upper contact structure 571b may be formed of a substantially same material layer formed by a substantially same process.

The semiconductor device may further include a data storage element 597 on the semiconductor substrate 500. The data storage element 597 may include first and second electrodes, and a data storage material layer provided between the first and second electrodes. The data storage element 597 may be disposed above one region 518b of the first impurity regions 518a and 518b of the first transistor AT1, and may be electrically connected to the region 518b via a cell contact structure 560, as illustrated in FIG. 1. The cell contact structure 560 may pass through the buffer insulating pattern 536 and through the first interlayer insulating layer 551. That is, the first transistor AT1 may be electrically connected to the first conductive pattern 539a via the first contact structure 538p and one first impurity region 518a, and to the data storage element 597 via the cell contact structure 560 and the other first impurity region 518b.

The data storage element 597 may include a data storage material layer of a volatile memory device such as DRAM, e.g., a capacitor dielectric layer, but is not limited thereto. For example, the data storage element 597 may include a ferroelectric material layer of FeRAM or a data storage material layer of a non-volatile memory device, e.g., a phase change material layer of PRAM. The data storage element 597 may be positioned at a higher level than the first conductive pattern 539a, as illustrated in FIG. 1, so, along the y-axis, a distance from a lower surface of the data storage element 597 from the upper surface 500a of the semiconductor substrate 500 may be larger than a distance from an upper surface of the first conductive pattern 539a from the upper surface 500a of the semiconductor substrate 500. At least a part of the data storage element 597 may be disposed at a substantially same level as or a lower level than the second conductive pattern 575. For example, as further illustrated in FIG. 1, a lower portion of the data storage element 597 may pass through the second interlayer insulating layer 584.

Arrangement of the data storage element 597, first conductive pattern 539a, and upper gate electrode 539g as described above may minimize a distance between the data storage element 597 and the first transistor AT1 along the first direction, e.g., the y-axis, so an overall thickness of the semiconductor device as measured along the first direction may be reduced. In other words, since the first conductive pattern 539a between the data storage element 597 and the first transistor AT1, i.e., the cell bit line, may be disposed at a substantially same level as the upper gate electrode 539g of a peripheral circuit region, i.e., second transistor AT2, both a distance between the first conductive pattern 539a and the first active region 503a and a distance between the data storage element 597 and the first active region 503a may be minimized. Accordingly, the overall thickness of the semiconductor device may be minimized, and a process margin for forming the cell contact structure 560 between the data storage element 597 and the first active region 503a may be increased.

Figure 2:
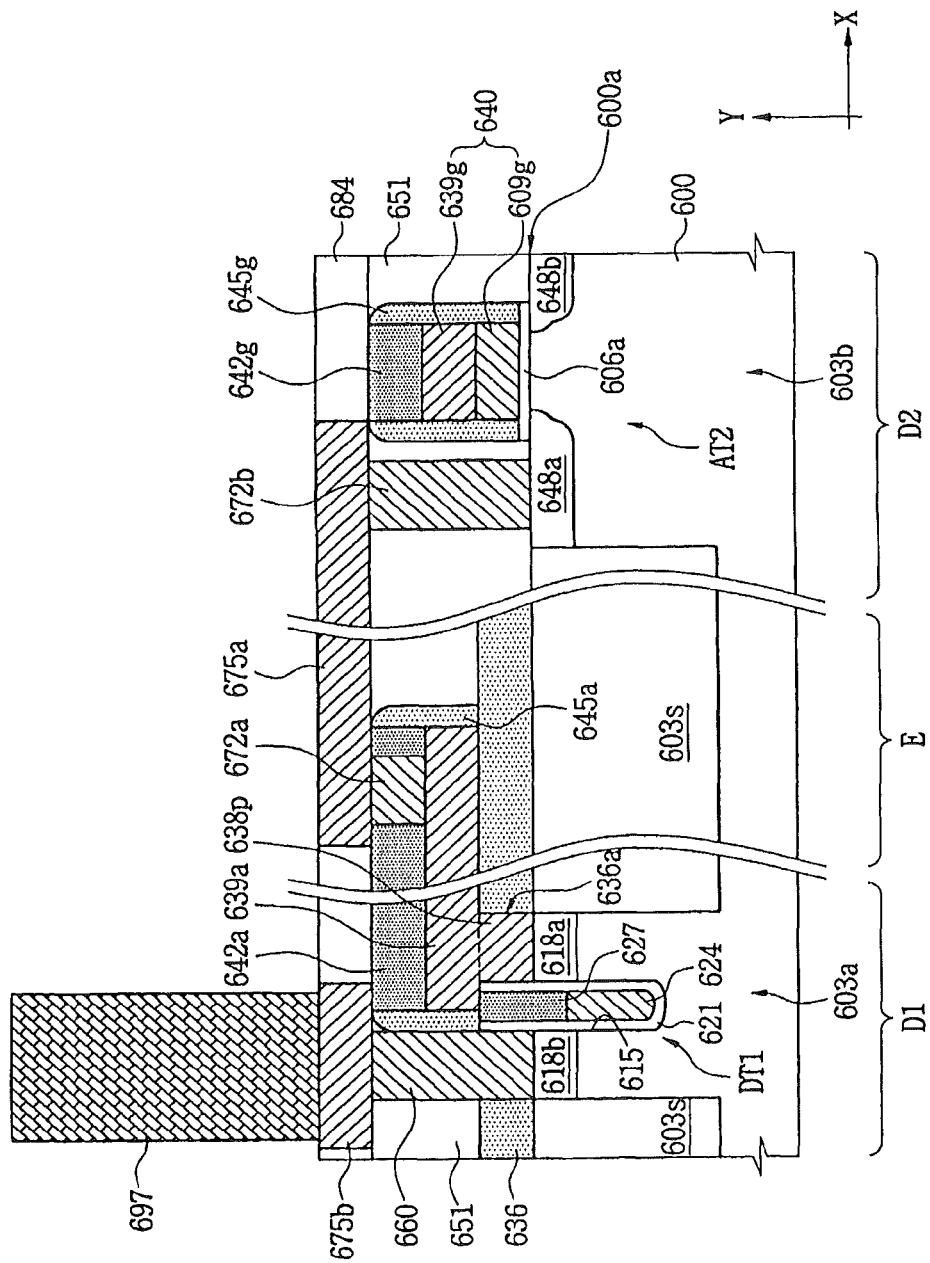
FIG. 2 illustrates a cross-sectional view of a semiconductor device according to another example embodiment.

A semiconductor device according to another example embodiment will be described below with reference to FIG. 2. Referring to FIG. 2, a semiconductor device may include substantially same elements as the semiconductor device described previously with reference to FIG. 1. Substantially same elements will be indicated as elements "corresponding" to elements described previously and their detailed description will not be repeated.

Referring to FIG. 2, a semiconductor device may include a semiconductor substrate 600 having first and second regions D1 and D2, and an intermediate region E, and first and second active regions 603a and 603b defined by an isolation region 603s. The semiconductor substrate 600 with the regions D1, D2, and E, and the active regions 603a and 603b defined by the isolation region 603s may be substantially the same as the semiconductor substrate 500 with the regions A1, A2, and B, and the active regions 503a and 503b defined by the isolation region 503s described previously with reference to FIG. 1, respectively.

As further illustrated in FIG. 2, the semiconductor device may include first and second transistors DT1 and DT2 on the semiconductor substrate 600. The first transistor DT1 may include first impurity regions 618a and 618b, a first gate dielectric layer 621, and a first gate pattern 624, which correspond to the first impurity regions 518a and 518b, the first gate dielectric layer 521, and the first gate pattern 524 of FIG. 1, respectively. The first gate pattern 624 may be provided in a gate trench 615 corresponding to the gate trench 515 of FIG. 1. The first transistor DT1 may further include a first gate capping pattern 627 on the first gate pattern 624 in the gate trench 615. The first gate capping pattern 627 may extend above an upper surface 600a of the semiconductor substrate 600, i.e., may have an upper surface disposed at a higher level than an upper surface of the first active region 603a. The first gate capping pattern 627 may be formed of an insulating material.

The second transistor DT2 may include second impurity regions 648a and 648b, a second gate dielectric layer 606a, and a second gate pattern 640, which correspond to the second impurity regions 548a and 548b, the second gate dielectric layer 506a, and the second gate pattern 540 of FIG. 1, respectively. The second gate pattern 640 may include a lower gate electrode 609g and an upper gate electrode 639g, which are sequentially stacked. A second gate capping pattern 642g and a second insulating spacer 645g, which respectively correspond to the second gate capping pattern 542g and a second insulating spacer 545g of FIG. 1, may be provided on the semiconductor substrate 600 of the second region D2.

A buffer insulating pattern 636 covering the isolation region 603s and the first impurity regions 618a and 618b may be provided on the first region D1 and the intermediate region E of the semiconductor substrate 600. The buffer insulating pattern 636 may be formed of an insulating material having an etch selectivity with respect to the first gate capping pattern 627. For example, when the first gate capping pattern 627 includes a silicon nitride layer, the buffer insulating pattern 636 may include a silicon oxide layer.

As further illustrated in FIG. 2, the semiconductor device may include a first conductive pattern 639a, a first insulating capping pattern 642a, a first insulating spacer 645a, and a first contact structure 638p, which correspond to the first conductive pattern 539a, the first insulating capping pattern 542a, the first insulating spacer 545a, and the first contact structure 538p described previously with reference to FIG. 1, respectively. A first interlayer insulating layer 651 corresponding to the first interlayer insulating layer 551 of FIG. 1 may be provided on the first and second regions D1 and D2, and the intermediate region E of the semiconductor substrate 600.

A cell contact structure 660 passing through the first interlayer insulating layer 651 and the buffer insulating pattern 636, and electrically connected to one region 618b of the first impurity regions 618a and 618b may be provided. A portion of the first gate capping pattern 627 projected above the first impurity regions 618a and 618b may be disposed between the cell contact structure 660 and the first contact structure 638p, as illustrated in FIG. 2. Therefore, the projection of the first gate capping pattern 627 may prevent short circuiting between the cell contact structure 660 and the first contact structure 638p. Portions of the first gate dielectric layer 621 may be disposed between the first gate capping pattern 627 and each of the cell contact structure 660 and the first contact structure 638p.

A second contact structure 672b passing through the first interlayer insulating layer 651 and electrically connected to one region 648a of the first impurity regions 648a and 648b may be provided. The second contact structure 672b may be provided at the substantially same level as the cell contact structure 660, e.g., upper surfaces of the second contact structure 672b and cell contact structure 660 may be substantially coplanar and lower surfaces of the second contact structure 672b and cell contact structure 660 may be substantially coplanar along the xz plane. The second contact structure 672b and the cell contact structure 660 may include a substantially same conductive material.

As further illustrated in FIG. 2, the semiconductor device may further include a conductive buffer pattern 675b and a second conductive pattern 675a on the first interlayer insulating layer 651. The conductive buffer pattern 675b may cover the cell contact structure 660, and the second conductive pattern 675a may cover the second contact structure 672b. The conductive buffer pattern 675b and the second conductive pattern 675a may be spaced apart along the x-axis, and may be disposed at a substantially same level, e.g., lower surfaces of the conductive buffer pattern 675b and the second conductive pattern 675a may be substantially coplanar along the xz-plane. The conductive buffer pattern 675b and the second conductive pattern 675a may be formed of a substantially same material.

A connection structure 672a may be interposed through the first insulating capping pattern 642a to connect the first and second conductive patterns 639a and 675a. For example, the first conductive pattern 639a, the connection structure 672a, and the second conductive pattern 675a may be sequentially stacked, so the connection structure 672a may be interposed between the first and second conductive patterns 639a and 675a, and may electrically connect the first and second conductive patterns 639a and 675a.

A second interlayer insulating layer 684 may be disposed on the first interlayer insulating layer 651 to surround sidewalls of the conductive buffer pattern 675b and of the second conductive pattern 675a. For example, upper surfaces of the second interlayer insulating layer 684, conductive buffer pattern 675b, and second conductive pattern 675a may be substantially coplanar in the xz-plane.

As further illustrated in FIG. 2, the semiconductor device may further include a data storage element 697 on the conductive buffer pattern 675b. Accordingly, the data storage element 697 may be positioned at a higher level than the second conductive pattern 675a, i.e., a lower surface of the data storage element 697 may be further from the upper surface 600a of the semiconductor substrate 600 than an upper surface of the second conductive pattern 675a. The data storage element 697 may correspond to the data storage element 597 of FIG. 1 in terms of type and components.

Figure 16A:
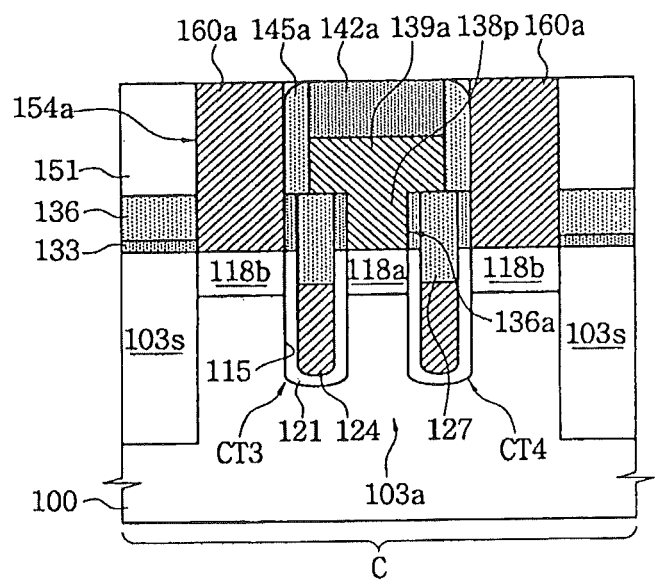
Figure 16B:
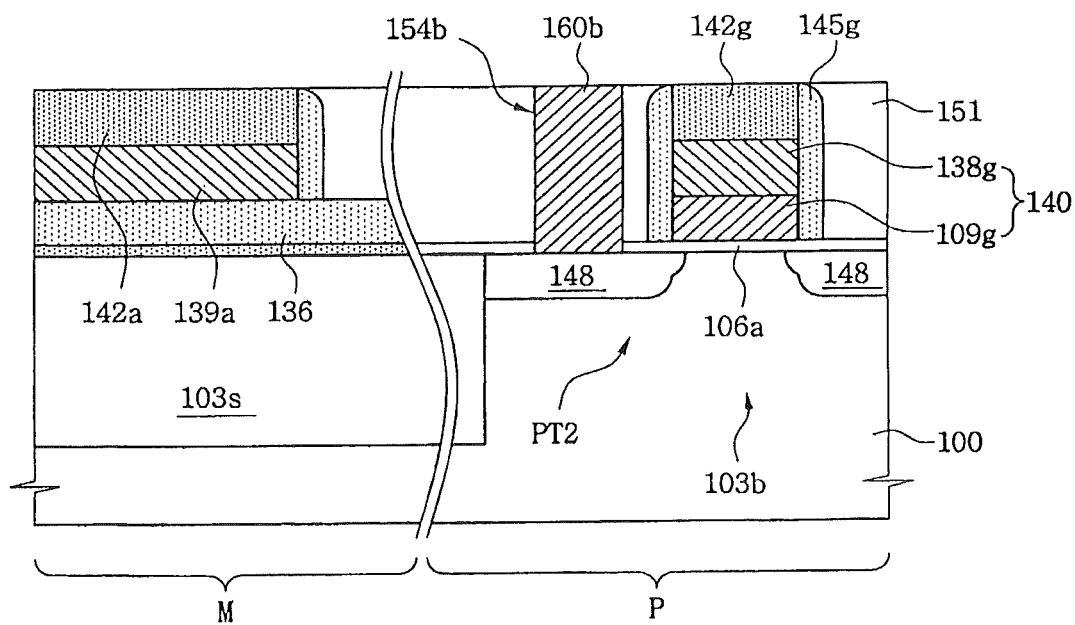
Figure 17A:
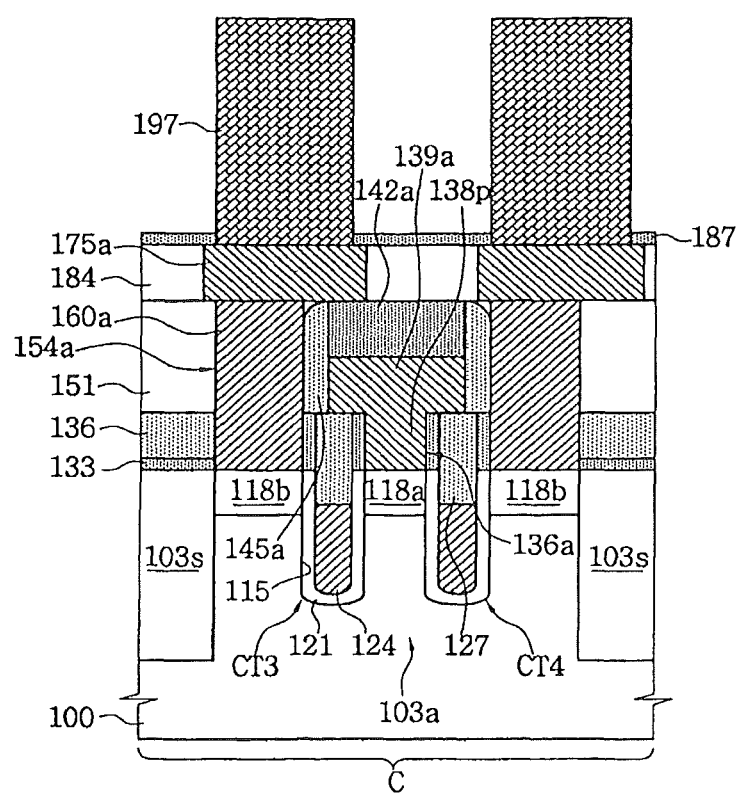
Figure 17B:
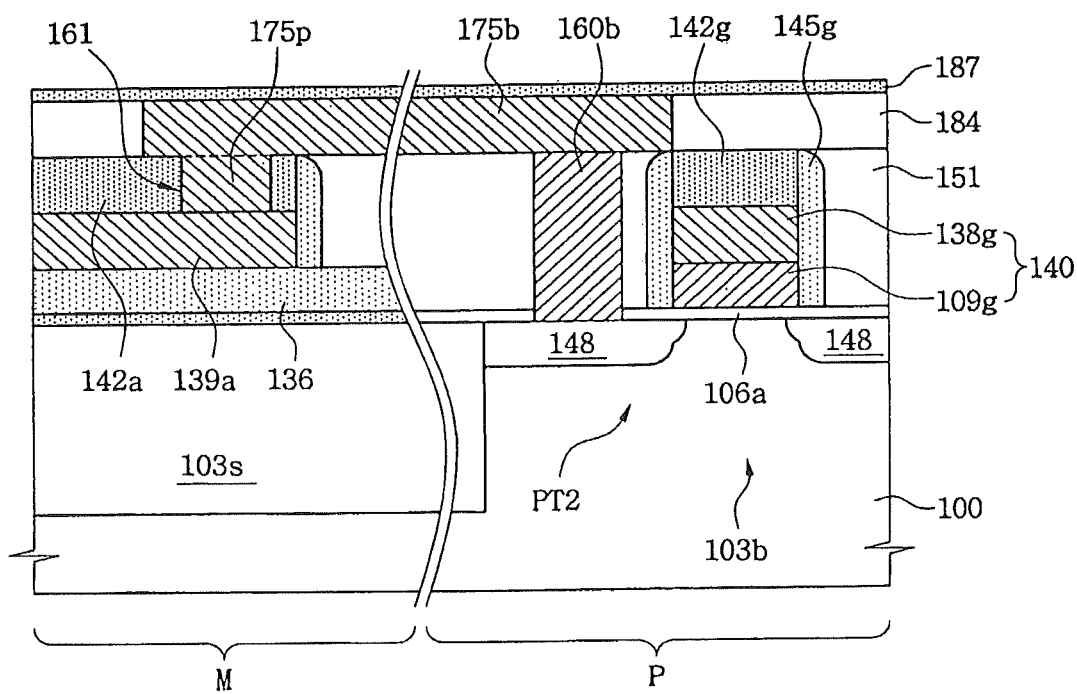
Figure 18A:
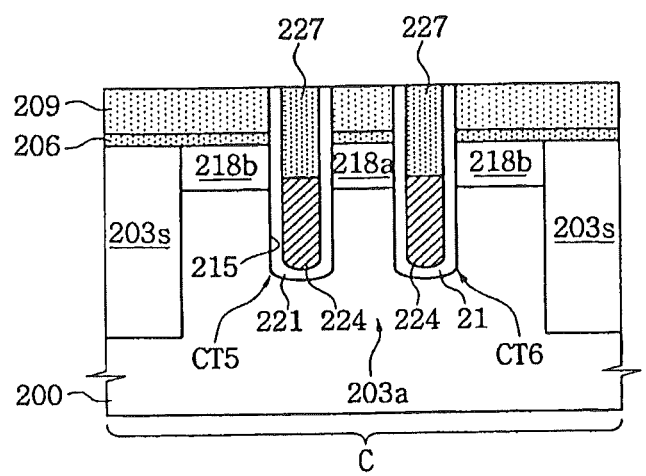
FIGS. 18A, 18B and 19 illustrate cross-sectional views of sequential stages in a method of fabricating a semiconductor device according to another example embodiment.
Figure 18B:
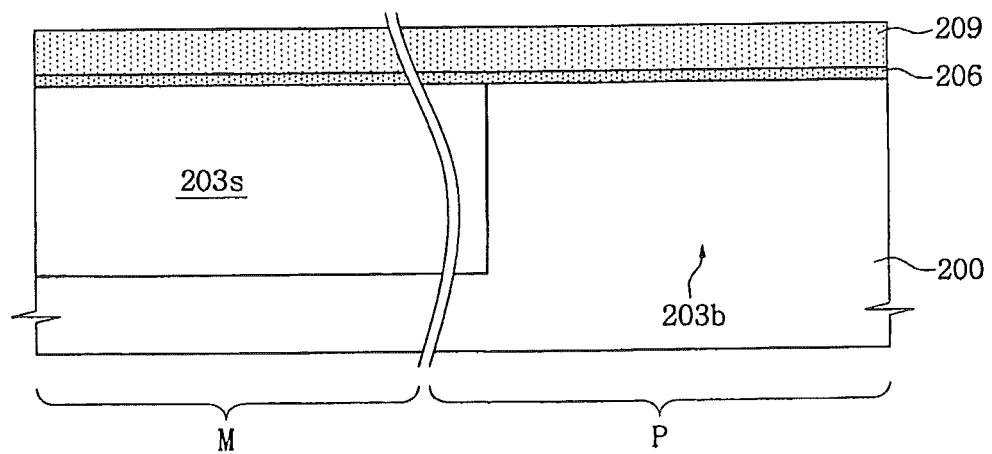
Figure 19:
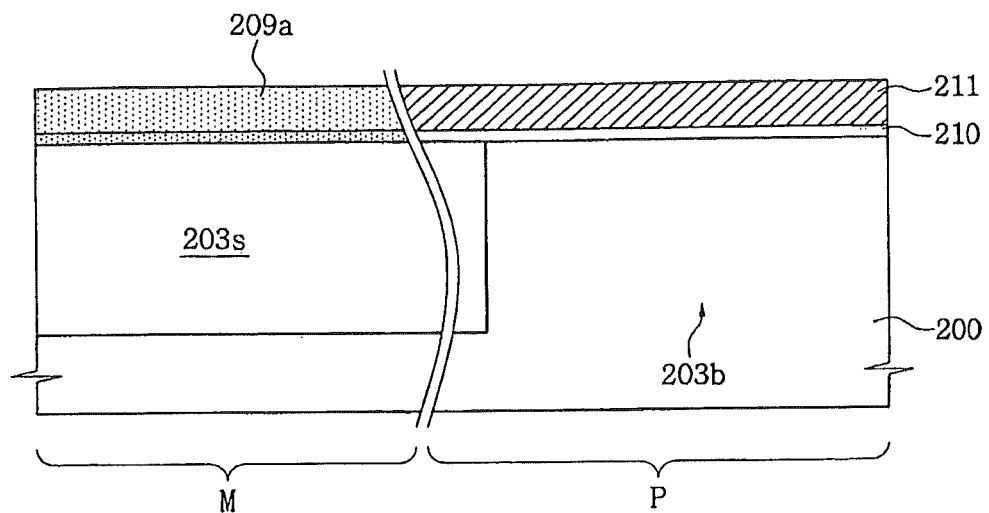

Methods of fabricating a semiconductor device according to example embodiments of will be described below with reference to FIG. 3-19, FIG. 3 illustrates a plan view of a semiconductor device according to an example embodiments, FIGS. 4A-12B illustrate cross-sectional views of a method of fabricating a semiconductor device according to an example embodiment, FIGS. 13A-17B illustrate cross-sectional views of a method of fabricating a semiconductor device according to another example embodiment, and FIGS. 18A-19 illustrate cross-sectional views of a method of fabricating a semiconductor device according to still another example embodiment.

Figure 3:
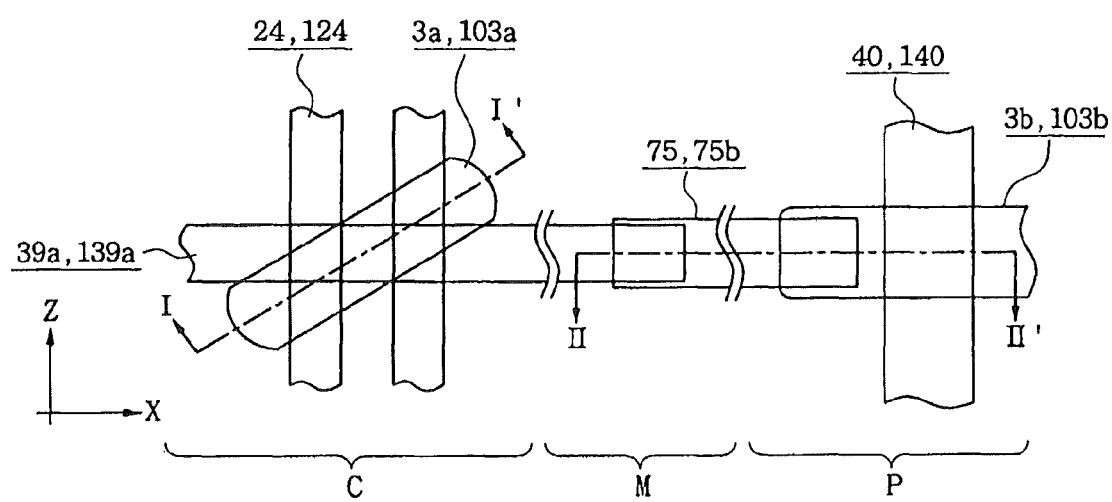
FIG. 3 illustrates a plan view of a semiconductor device according to example embodiments.

It is noted that FIGS. 4A, 5A, 6A, 7A, 8A, 9A, 10A, 11A, 12A, 13A, 14A, 15A, 16A, 17A and 18A illustrate sequential cross-sectional views along line I-I' of FIG. 3, and FIGS. 4B, 5B, 6B, 7B, 8B, 9B, 10B, 11B, 12B, 13B, 14B, 15B, 16B, 17B, 18B and 19 illustrate cross-sectional views along line II-II' of FIG. 3. In FIGS. 3-19, reference mark C represents a first region, reference mark M represents an intermediate region, and reference mark P represents a second region.

First, a method of fabricating a semiconductor device according to an example embodiment will be described below with reference to FIGS. 3, and 4A-12B.

Figure 4A:
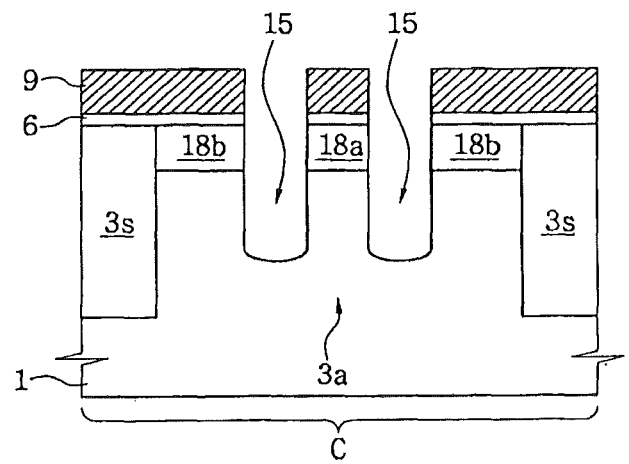
FIGS. 4A to 12B illustrate cross-sectional views of sequential stages in a method of fabricating a semiconductor device according to an example embodiment.
Figure 4B:
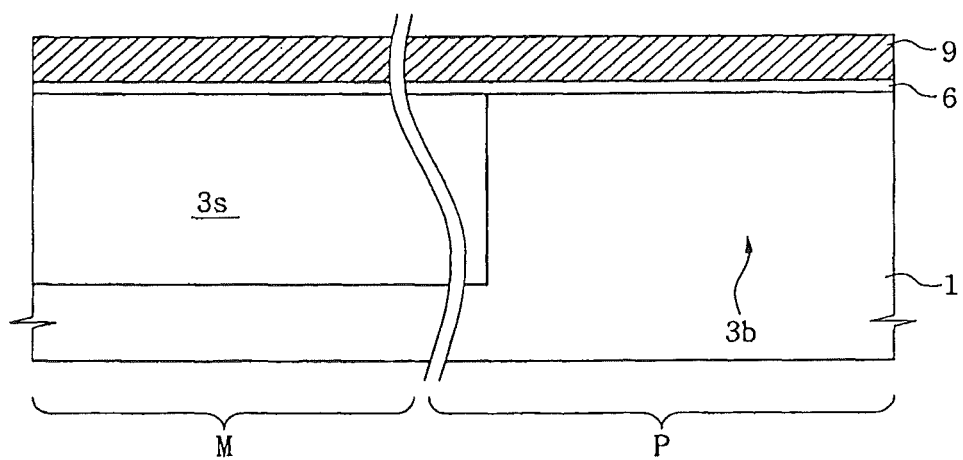

Referring to FIGS. 3 and 4A-4B, a semiconductor device may include a semiconductor substrate 1 having first and second regions C and P, and an intermediate region M, and first and second active regions 3a and 3b defined by an isolation region 3s. The semiconductor substrate 1 with the regions C, P, and M, and the active regions 3a and 3b defined by the isolation region 3s may correspond to the semiconductor substrate 500 with the regions A1, A2, and B, and the active regions 503a and 503b defined by the isolation region 503s described previously with reference to FIG. 1, respectively.

A preliminary impurity region (not shown) having a different conductivity type as compared to region C of the semiconductor substrate 1 may be formed in the first active region 3a. For example, when the first active region 3a is a P type, impurity ions may be implanted into the first active region 3a, so that a preliminary impurity region (not shown) of an N-type may be formed in an upper region of the first active region 3a.

A dielectric layer 6 and a gate conductive layer 9, which may be sequentially stacked, may be formed on the semiconductor substrate 1. The dielectric layer 6 may be formed to include at least one of a silicon oxide layer and high K dielectrics. Here, the high K dielectrics may include a dielectric material having a higher dielectric constant than a silicon oxide layer. The gate conductive layer 9 may be formed of a conductive material layer, e.g., a polysilicon layer.

The gate conductive layer 9 and the dielectric layer 6 on the first region C may be patterned to expose predetermined portions of first active region 3a and the isolation region 3s. Then, the exposed portions of the first active region 3a and the isolation region 3s may be etched to form a gate trench 15. The gate trench 15 may be formed to cross the first active region 3a and extend toward the isolation region 3s. The gate trench 15 may have a smaller line width than a resolution limit of a lithography process.

The gate trench 15 may be formed to cross the first active region 3a in the preliminary impurity region. Therefore, the preliminary impurity region may be divided into cell impurity regions spaced apart from each other by the gate trench 15, i.e., the gate trench 15 may define cell source/drain regions 18a and 18b. For example, the preliminary impurity region may be divided into three cell impurity regions 18a and 18b by a pair of gate trenches 15. If three cell impurity regions are formed, one impurity region disposed between the pair of gate trenches 15 may be defined as a first cell impurity region 18a, and the remaining impurity regions may be defined as second impurity regions 18b.

Figure 5A:
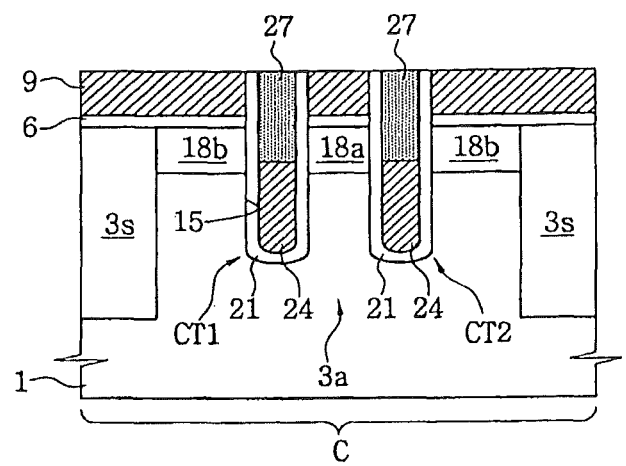
Figure 5B:
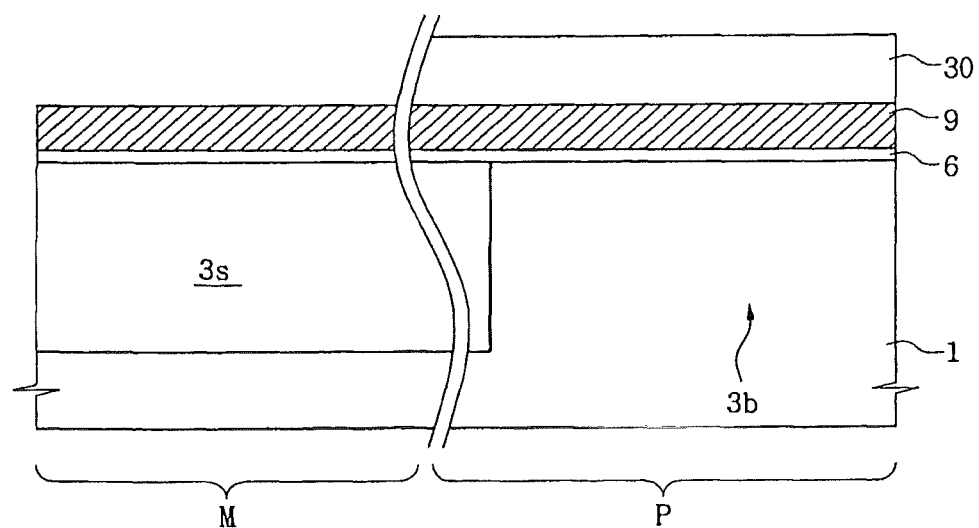

Referring to FIGS. 3, 5A-5B, a cell gate dielectric layer 21 may be formed on the semiconductor device having the cell gate trench 15. The cell gate dielectric layer 21 may be formed to coat an internal wall of the cell gate trench 15 in the first active region 3a. The cell gate dielectric layer 21 may be formed to include at least one of a silicon oxide layer and high K dielectric layer.

A cell gate pattern 24 may be formed on cell gate dielectric layer 21 in the cell gate trench 15. The cell gate pattern 24 may fill at least a part of the gate trench 15. For example, the cell gate pattern 24 may partially fill the gate trench 15, so an upper surface of the first active region 3a may be higher than an upper surface of the cell gate pattern 24 along the y-axis, i.e., the upper surface of the first active region 3a may be further from a bottom of the gate trench 15 than the upper surface of the cell gate pattern 24. The cell gate pattern 24 at a portion crossing the cell active region 3a may be defined as a cell gate electrode. The cell gate pattern 24 may be formed to include at least one of a metal layer, a metal nitride layer, a metal silicide layer, and a polysilicon layer. The cell source/drain regions 18, the cell gate dielectric layer 21, and the cell gate pattern 24 may constitute cell transistors CT1 and CT2. That is, the cell transistors CT1 and CT2 may be buried channel array transistors (BCAT).

A cell gate capping pattern 27 filling a remaining portion of the gate trench 15 may be formed. The cell gate capping pattern 27 may be formed on the cell gate pattern 24 to include at least one of a silicon oxide layer, a silicon nitride layer, and a silicon oxynitride layer.

A mask pattern 30 may be formed on the gate conductive layer 9 in the second region P, so a portion of the gate conductive layer 9 in the first region C and the intermediate region M may be exposed by the mask pattern 30. The mask pattern 30 may be a photoresist pattern. Alternatively, the mask pattern 30 may be formed of an insulating layer, e.g., a silicon oxide layer or a silicon nitride layer.

Figure 6A:
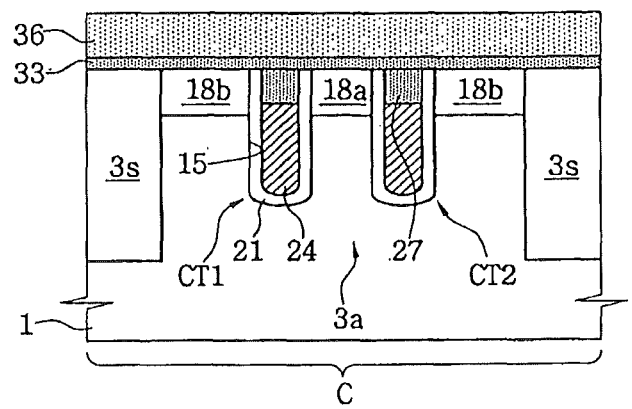
Figure 6B:
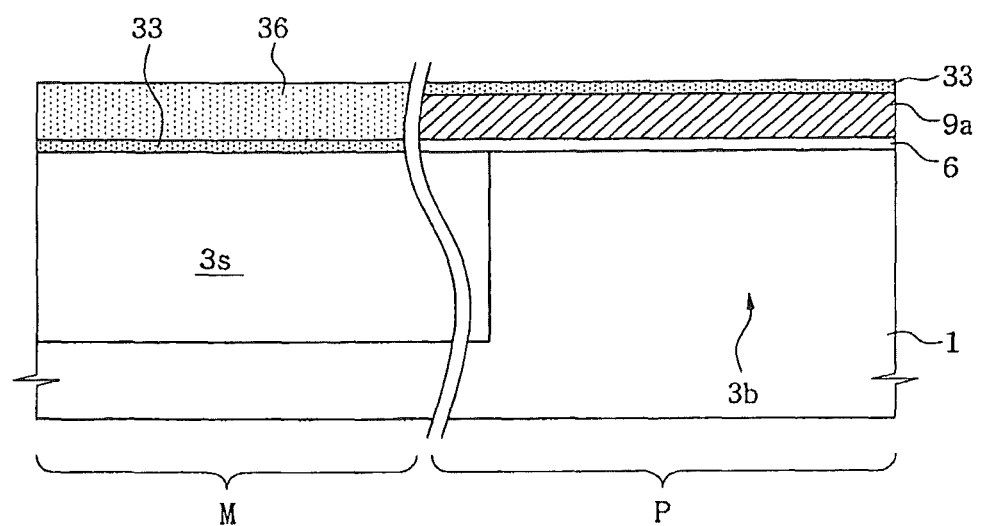

Referring to FIGS. 3 and 6A-6B, the gate conductive layer 9 in the first region C and the intermediate region M may be etched using the mask pattern 30 as an etch mask to form a gate conductive pattern 9a in the second region P. It is noted that in other embodiments, i.e., an example embodiment including a different method of fabricating the first impurity regions 18a and 18b as compared to the method described previously, the gate conductive pattern 9a may be used to perform an ion implantation process on the substrate 1 to form first impurity regions, i.e., cell source/drain regions 18a and 18b, in the cell active region 3a. It is further noted that while the first region C, the intermediate region M, and the second region P are etched, a part of the dielectric layer 6, the cell gate dielectric layer 21, and the cell gate capping pattern 27 may be etched.

Once the gate conductive pattern 9a is formed, the mask pattern 30 may be removed. A stop layer 33 may be formed on a portion of the semiconductor substrate 1 from which the mask pattern 30 was removed. The stop layer 33 may be formed of an insulating material having an etch selectivity with respect to the isolation region 3s. For example, when the isolation region 3s is formed of a silicon oxide layer, the stop layer 33 may be formed of a silicon nitride layer. The stop layer 33 may be conformally formed. The stop layer 33 may cover the isolation region 3s and the cell transistors CT1 and CT2 of the first region C, and may cover the gate conductive pattern 9a in the second region P.

A buffer insulating layer (not shown) may be formed on the stop layer 33. The buffer insulating layer may be formed of a material layer having an etch selectivity with respect to the stop layer 33. For example, when the stop layer 33 is formed of a silicon nitride layer, the buffer insulating layer may be formed of a silicon oxide layer. The buffer insulating layer may be planarized to expose an upper surface of the stop layer 33 in M region and an upper surface of the gate conductive pattern 9a in the second region P, so that a planarized buffer insulating pattern 36 may be formed on the stop layer 33 in the first region C.

Figure 7A:
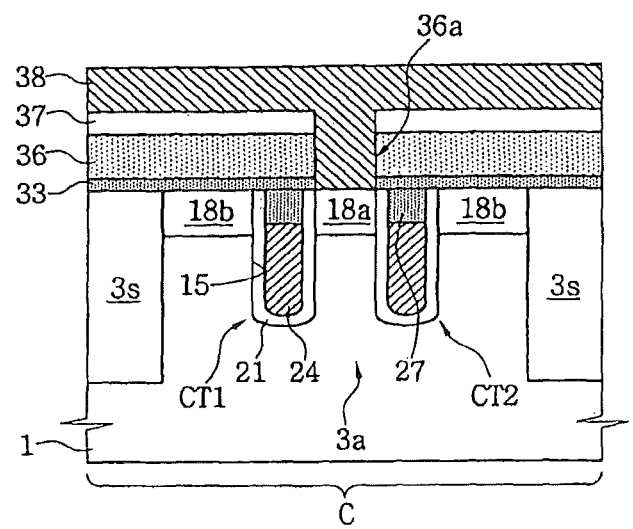
Figure 7B:
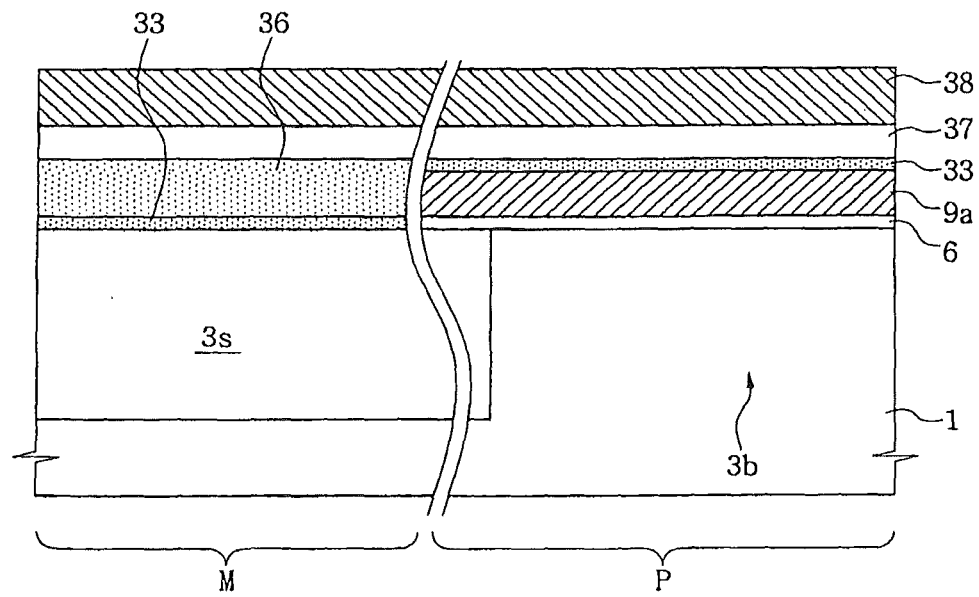

Referring to FIGS. 3 and 7A-7B, a capping insulating layer 37 may be formed on the buffer insulating pattern 36. The capping insulating layer 37 may be formed of an insulating material such as a silicon oxide layer or a silicon nitride layer. The capping insulating layer 37, the buffer insulating pattern 36, and the stop layer 33 may be patterned to form a bit line contact hole 36a exposing the first impurity region 18a. For example, the bit line contact hole 36a may be formed to expose the first cell impurity region 18a sharing the cell transistors CT1 and CT2.

A first conductive layer 38 may be formed on the semiconductor substrate 1 having the bit line contact hole 36a. The first conductive layer 38 may be formed to include at least one of a metal layer, a metal nitride layer, a metal silicide layer and a polysilicon layer. For example, the first conductive layer 38 may be formed to include a Ti layer, a TiN layer, and a W layer, which are sequentially stacked. Here, the W layer may fill the bit line contact hole 36a, and the Ti and the TiN layers, which are sequentially stacked, may be interposed between an internal wall of the bit line contact hole 36a and the W layer to function as a diffusion barrier layer.

A portion of the first conductive layer 38 in contact with the first impurity region 18a may be formed of metal silicide. For example, a metal silicide layer may be formed on the first impurity region 18a, and a metal material layer may fill the bit line contact hole 36a to form the first conductive layer 38. In another example, first and second may be sequentially deposited in the bit line contact hole 36a, followed by an annealing process of the metal layers, so that a metal of the first metal layer may react with silicon of the first impurity region 18a to form a metal silicide layer between the first conductive layer 38 and the first impurity region 18a.

Figure 8A:
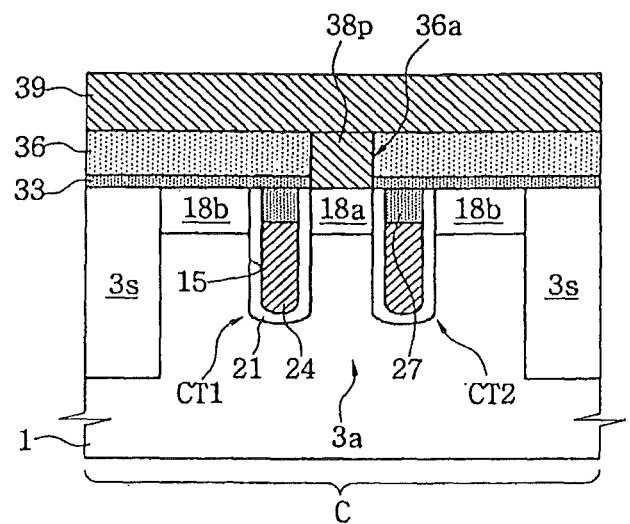
Figure 8B:
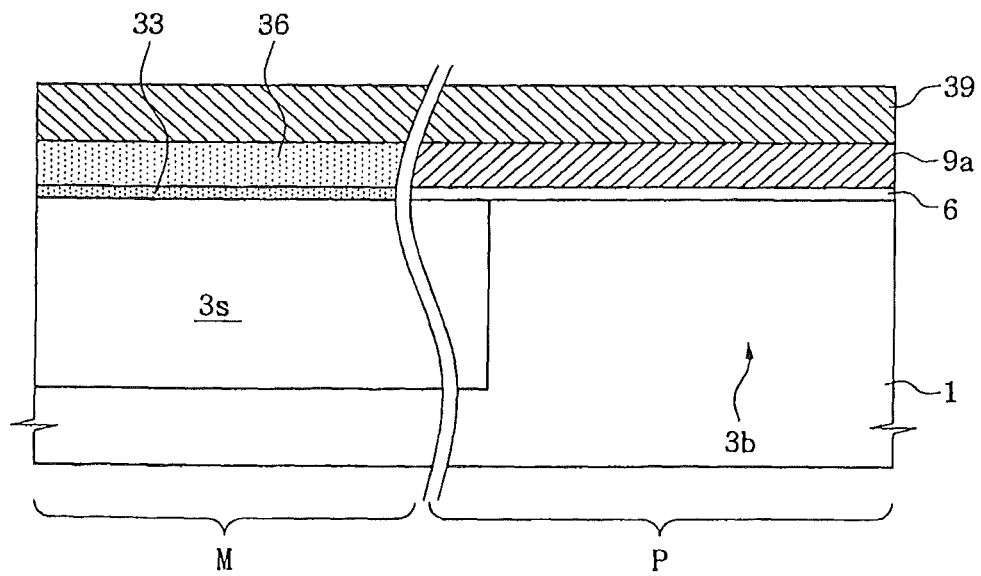

Referring to FIGS. 3 and 8A-8B, the first conductive layer 38 may be processed to form a first contact structure, i.e., a bit line contact structure 38p, in the bit line contact hole 36a. For example, the first conductive layer 38 may be planarized, e.g., by a chemical mechanical polishing (CMP), to expose the stop layer 33 in the second region P, followed by etching of the stop layer 33. In another example, the first conductive layer 38 may be planarized to expose the gate conductive pattern 9a in the second region P. The capping layer 37 may be removed during the planarization process.

Next, a second conductive layer 39 covering the bit line contact structure 38p and the exposed gate conductive pattern 9a may be formed. The second conductive layer 39 may be formed to include at least one of a metal layer, a metal nitride layer, a metal silicide layer, and a polysilicon layer. In an example embodiment, the second conductive layer 39 may be formed to include a different conductive material from the gate conductive pattern 9a. The second conductive layer 39 may be formed to include a conductive material layer having a higher electric conductivity than the gate conductive pattern 9a. For example, the gate conductive pattern 9a may be formed of a doped polysilicon layer, and the second conductive layer 39 may be formed to include a metal material layer such as a tungsten layer. Here, taking into account ohmic contact characteristics between a metal material layer such as a tungsten layer and the gate conductive pattern 9a, a portion of the second conductive layer 39 being in contact with the gate conductive pattern 9a may be formed of a metal silicide layer. In another example embodiment, the gate conductive pattern 9a and the second conductive layer 39 may be formed of a substantially same conductive material layer.

In some example embodiments, after the buffer insulating pattern 36 of FIGS. 7A and 7B is formed, or while forming the buffer insulating pattern 36, a process of exposing the gate conductive pattern 9a in the second region P may be performed. For example, the buffer insulating layer 36 may be planarized to expose the gate conductive pattern 9a, so the stop layer 33 in the second region P may be removed during the planarization process. In another example, after the buffer insulating layer 36 is planarized using the stop layer 33 as a planarization stop layer 33 in the second region P, the stop layer 33 in the second region P may be etched, so the buffer insulating pattern 36 and the stop layer 33 may be patterned to form the bit line contact hole 36a exposing the first impurity region 18a. A conductive layer filling the bit line contact hole 36a and covering the buffer insulating pattern 36 and the gate conductive pattern 9a, e.g., a conductive layer of the same material layer as the first conductive layer 38, may be formed. Accordingly, the second conductive layer 39 and the bit line contact structure 38p may be formed to include the same material layer formed by the same process.

Figure 9A:
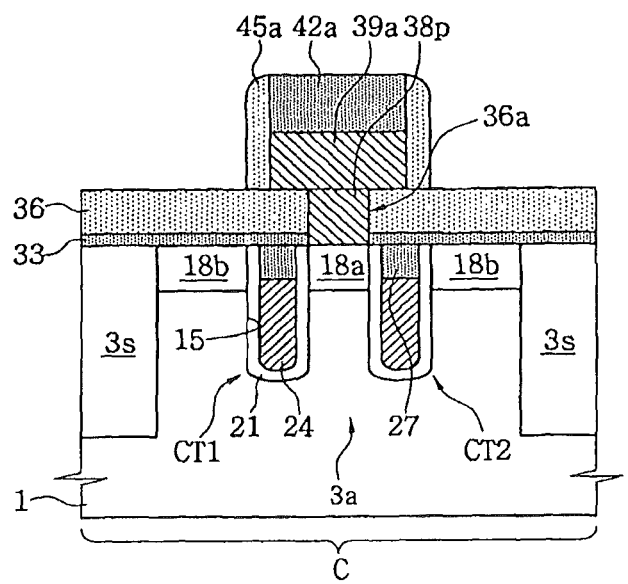
Figure 9B:
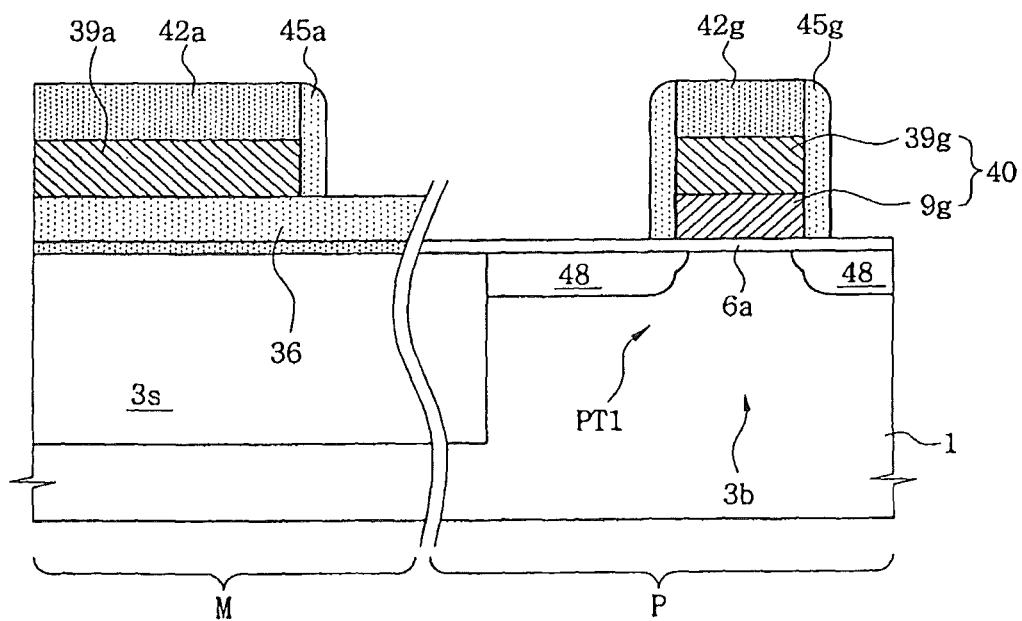

Referring to FIGS. 3 and 9A-9B, a mask layer may be formed on the second conductive layer 39. The mask layer may be formed to include at least one of a silicon oxide layer, a silicon nitride layer and a silicon oxynitride layer. The mask layer, the second conductive layer 39, and the gate conductive pattern 9a may be patterned, so that a first conductive pattern 39a and a bit line capping pattern 42a, which are sequentially stacked, may be formed on the first region C, and a first peripheral gate electrode 9g, a second peripheral gate electrode 39g, and a peripheral capping pattern 42b, which are sequentially stacked on the second region P, may be formed. Accordingly, the first conductive pattern 39a and the second peripheral gate electrode 39g may be simultaneously formed and may be formed of the same material layer. Further, the first conductive pattern 39a and the second peripheral gate electrode 39g may be disposed substantially at the same level.

The first and second peripheral gate electrodes 9g and 39g may be defined as a peripheral gate pattern 40. The first conductive pattern 39a may be defined as a cell bit line. The peripheral gate pattern 40 and the first conductive pattern 39a may respectively correspond to the peripheral gate pattern 540 of FIGS. 1 and 640 of FIG. 2 and the first conductive pattern 539a of FIGS. 1 and 639a of FIG. 2. The cell bit line 39a may extend up to the intermediate region M. The peripheral gate pattern 40 may be substantially linear, and may extend on the isolation region 3s crossing the peripheral active region 3b and defining the peripheral active region 3b. Moreover, a peripheral gate dielectric layer 6a may be provided between the peripheral gate pattern 40 and the peripheral active region 3b.

A bit line spacer 45a may be formed on a sidewall of the cell bit line 39a and the bit line capping pattern 42a, which are sequentially stacked. A peripheral gate spacer 45g may be formed on sidewalls of the peripheral gate pattern 40 and the peripheral gate capping pattern 42g, which are sequentially stacked. The peripheral gate spacer 45g and the bit line spacer 45a may be formed to include at least one of a silicon nitride layer, a silicon oxynitride layer, and a silicon oxide layer.

Impurity ions may be implanted into the peripheral active region 3b at both sides of the peripheral gate pattern 40 to be activated, so that peripheral impurity regions, i.e., peripheral source/drain regions 48, may be formed. Therefore, a peripheral transistor PT1 including the peripheral source/drain regions 48, the peripheral gate dielectric layer 6a, the peripheral gate pattern 40 and a channel region in the peripheral active region 3b under the peripheral gate pattern 40 may be formed.

Figure 10A:
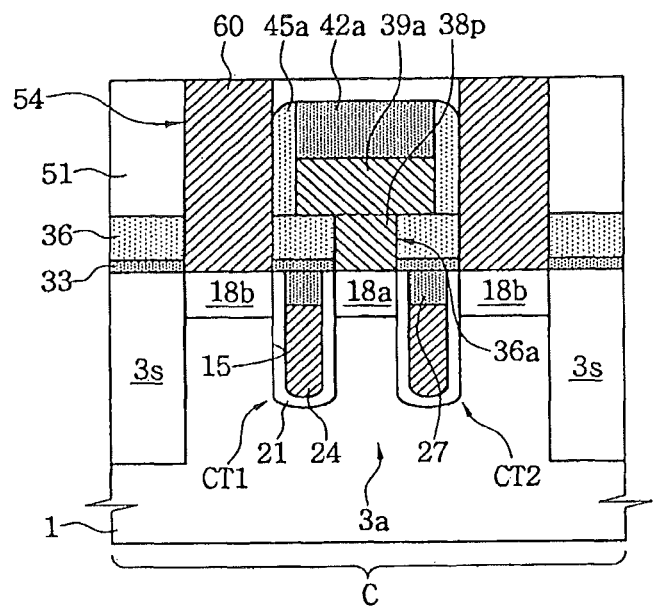
Figure 10B:
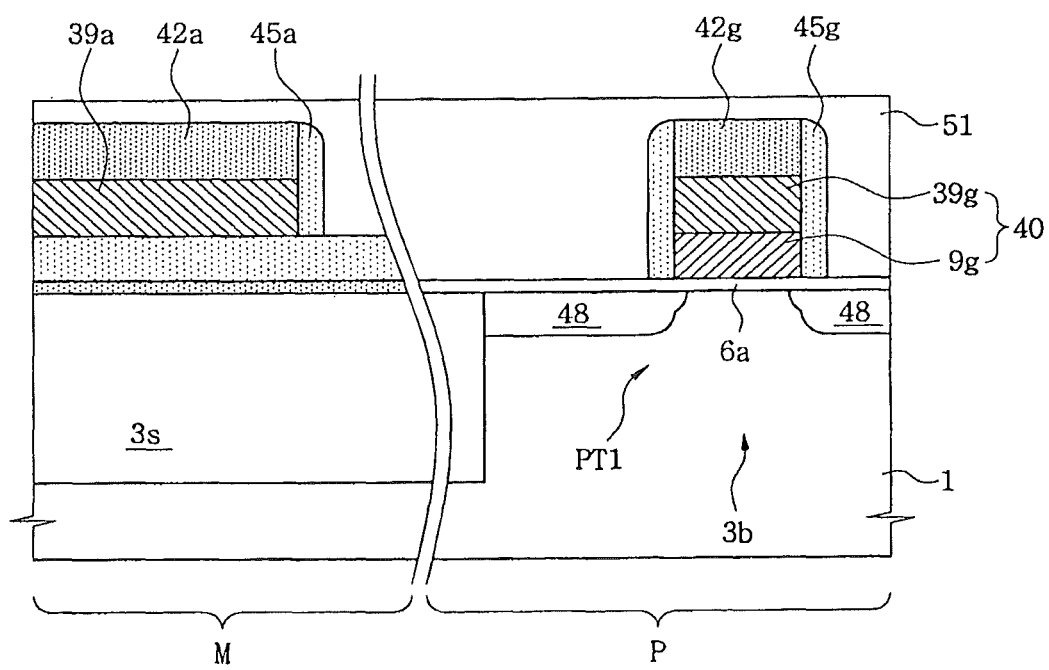

Referring to FIGS. 3, 10A and 10B, a first interlayer insulating layer 51 may be formed on the semiconductor substrate 1 having the cell bit line 39a and the peripheral transistor PT1. The first interlayer insulating layer 51 may be formed to have a substantially planarized upper surface. For example, an insulating material layer may be formed on the semiconductor substrate 1 having the cell bit line 39a and the peripheral transistor PT1, and a planarization process, e.g., the CMP process, may be performed on the insulating material layer, so that the first interlayer insulating layer 51 having the planarized upper surface may be formed. During the planarization process for forming the first interlayer insulating layer 51, the bit line capping pattern 42a and the peripheral gate capping pattern 42g may be used. Therefore, while the first interlayer insulating layer 51 may have the planarized upper surface as illustrated in FIG. 1, it is not limited thereto, and the first interlayer insulating layer 51 may have a planarized upper surface so that upper surfaces of the bit line capping pattern 42a and the peripheral gate capping pattern 42g are exposed.

In the first region C, the first interlayer insulating layer 51, the buffer insulating pattern 36, and the stop layer 33 may be sequentially patterned, so that cell contact holes 54 exposing the second cell impurity regions 18b out of the first and second impurity regions 18a and 18b of the first region C may be formed.

In some embodiments, since the cell bit line 39a is disposed substantially at the same level as the second peripheral gate electrode 39g of the peripheral transistor PT2, the overall thickness of the device is not increased due to the cell bit line 39a. Accordingly, the cell contact holes 54 may be substantially formed by etching the insulating layers of thicknesses formed by forming the peripheral transistor PT1. This process may reduce an etching process time required to form the cell contact holes 54, and increase an etching process margin. Further, since the cell bit line 39a and the second peripheral gate electrode 39g may be simultaneously formed without any separate process for forming the cell bit line 39a, the overall process time may be reduced.

Cell contact structures 60 filling the cell contact holes 54 may be formed. The cell contact structures 60 may be formed to include at least one of a metal layer, a metal nitride layer, a metal silicide layer, and a polysilicon layer. For example, the cell contact structures 60 may include a metal layer filling the cell contact holes 54, and may include a diffusion barrier layer interposed between the metal layer and internal walls of the cell contact holes 54. Also, a portion in contact with the second cell impurity regions 18b exposed by a lower region of the cell contact structures 60, i.e., the cell contact holes 54, may be formed of a metal silicide layer. For example, a metal silicide layer may be formed on the second cell impurity regions 18b, and a conductive material layer filling the cell contact holes 54 may be formed, so that the cell contact structures 60 may be formed. Alternatively, forming the cell contact structures 60 may include performing an annealing process on a metal layer and a metal nitride layer sequentially covering internal walls of the cell contact holes 54, and reacting a metal element of the metal layer with a silicon element of the second cell impurity regions 18b to form a metal silicide layer.

Figure 11A:
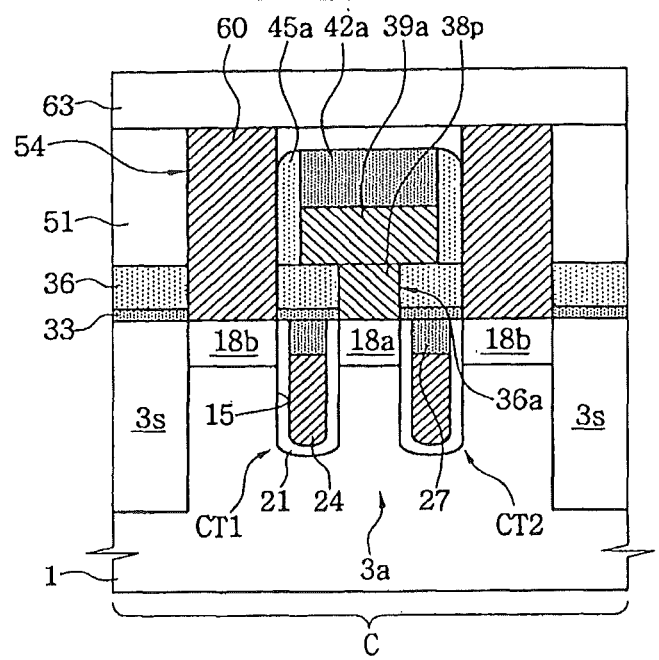
Figure 11B:
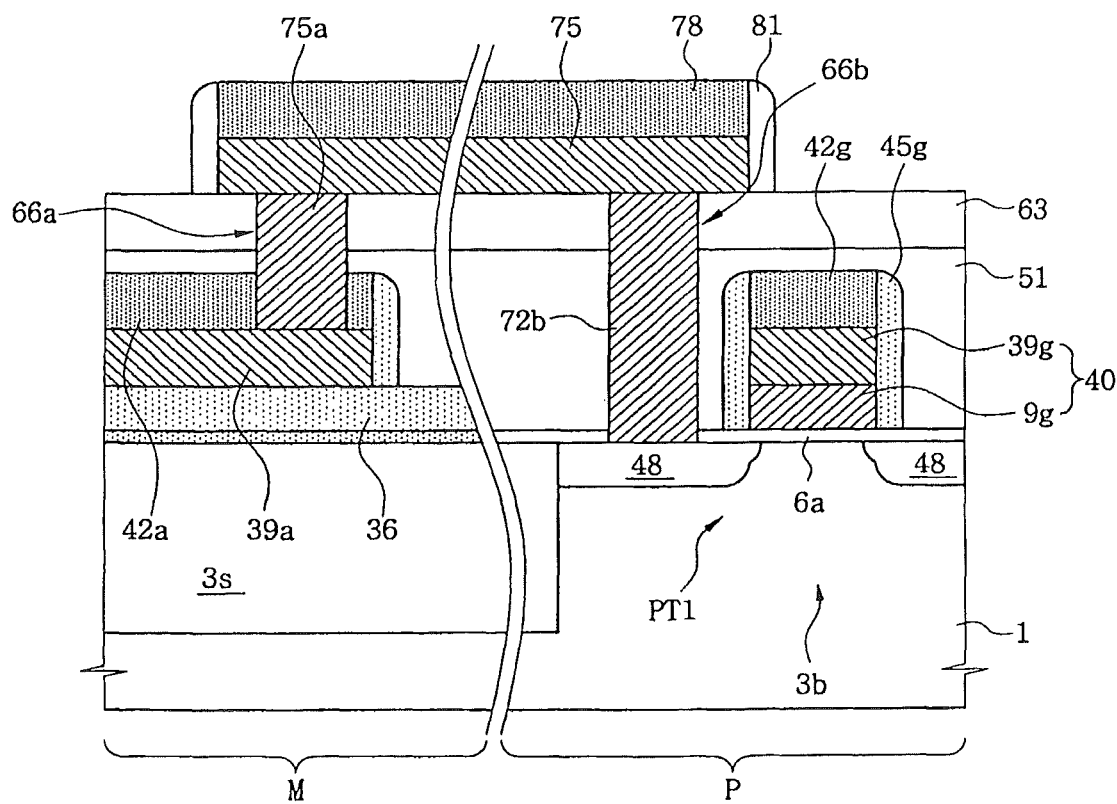

Referring to FIGS. 3, 11A and 11B, a second interlayer insulating layer 63 may be formed on the first interlayer insulating layer 51. In the second region P, a peripheral contact hole 66b passing through the first and second interlayer insulating layers 51 and 63, and exposing at least one of the peripheral impurity regions 48 may be formed. Moreover, in the intermediate region M, a connection via hole 66a passing through the second interlayer insulating layer 63 and the bit line capping pattern 42a, and exposing a predetermined region of the cell bit line 39a may be formed.

A connection structure 75a filling the connection via hole 66a may be formed, and a conductive peripheral contact structure 72b filling the peripheral contact hole 66b may be formed. The connection structure 75a and the peripheral contact structure 72b may be formed to include at least one of a metal layer, a metal nitride layer, a metal silicide layer, and a polysilicon layer.

The peripheral contact structure 72b may be formed to include a different conductive material from the cell contact structure 60. For example, when the cell contact structure 60 includes a polysilicon layer, the peripheral contact structure 72b may include a metal material layer, e.g., tungsten.

A second conductive pattern 75 and an interconnection capping pattern 78, which are sequentially stacked, may be formed on the second interlayer insulating layer 63. The second conductive pattern 75 may cover the connection structure 75a and the peripheral contact structure 72b. The second conductive pattern 75 may be formed to include at least one of a metal layer, a metal nitride layer, and a polysilicon layer. The interconnection capping pattern 78 may be formed of an insulating material layer such as a silicon nitride layer. Forming the interconnection capping pattern 78 may be omitted.

In another example embodiment, the second conductive pattern 75, the connection structure 75a, and the peripheral contact structure 72b may be simultaneously formed of a conductive material. For example, a conductive material layer filling the connection via hole 66a and the peripheral contact hole 66b and covering the second interlayer insulating layer 63 may be formed, and the conductive material layer may be patterned to integrally form the second conductive pattern 75, the connection structure 75a, and the peripheral contact structure 72b.

The cell transistors CT1 and the peripheral transistor PT1 may be electrically connected to each other by the second conductive pattern 75. More specifically, one of the peripheral impurity regions 48 of the peripheral transistor PT1 and the cell impurity region 18a of the cell transistors CT1 and CT2 may be electrically connected to each other through the bit line contact structure 38p, the first conductive pattern 39a, the connection structure 75a, the second conductive pattern 75 and the peripheral contact structure 72b. An interconnection spacer 81 may be formed on sidewalls of the second conductive pattern 75 and the interconnection capping pattern 78.

Figure 12A:
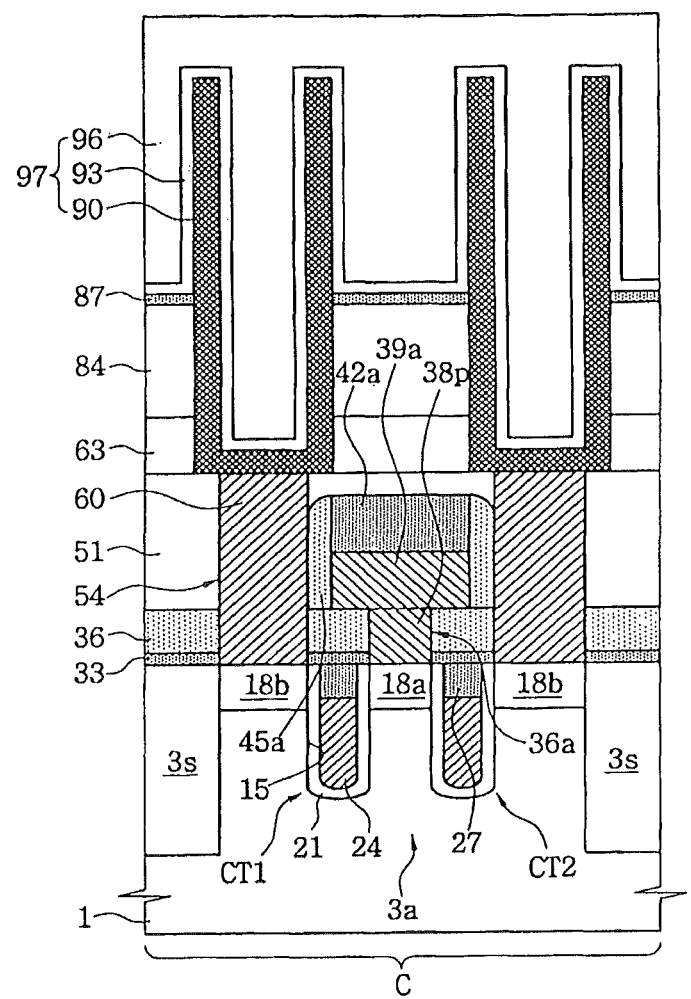
Figure 12B:
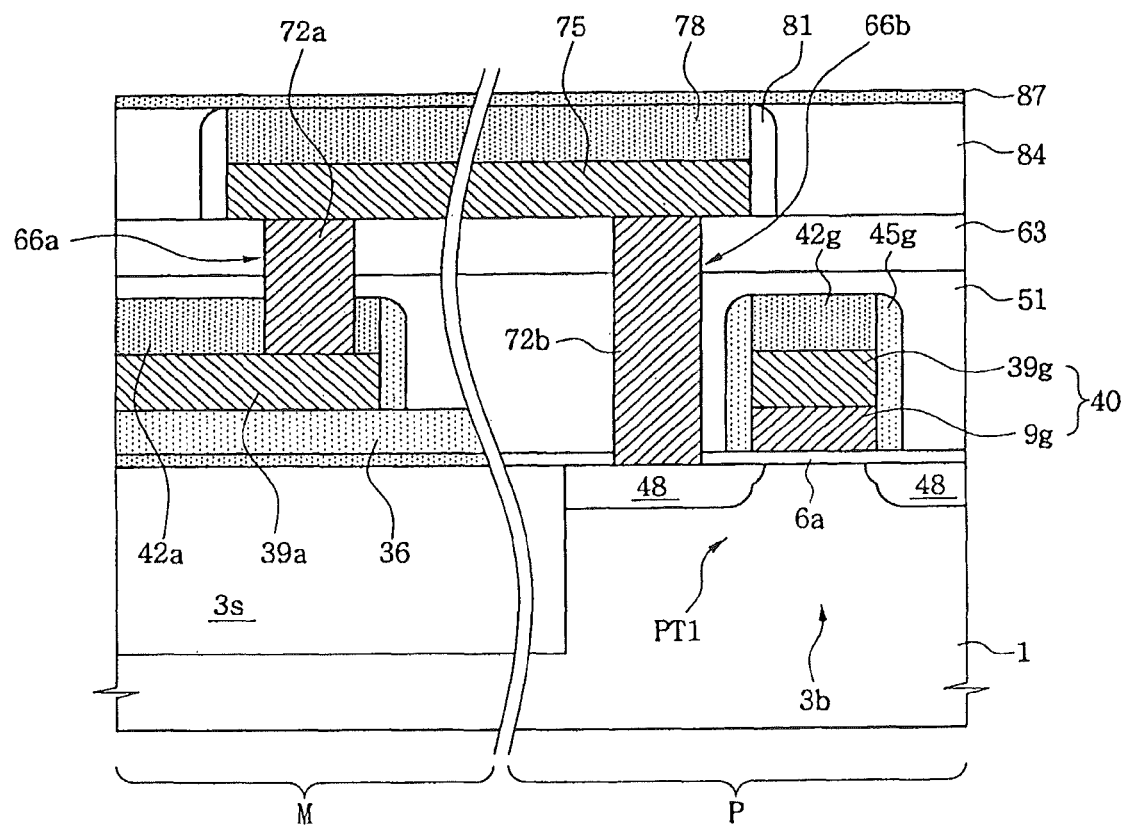

Referring to FIGS. 3, 12A, and 12B, a third interlayer insulating layer 84 may be formed on the semiconductor substrate having the second conductive pattern 75. The third interlayer insulating layer 84 may be planarized. An etch stop layer 87 may be formed on the third interlayer insulating layer 84.

A data storage element 97 passing through the etch stop layer 87, the third interlayer insulating layer 84, and the second interlayer insulating layer 63, and electrically connected to the cell contact structures 60 and upwardly projecting above the etch stop layer 87 along the y-axis, may be formed. The data storage element 97 may include a first electrode 90, a second electrode 96, and a data storage material layer 93 between the first and second electrodes 90 and 96.

When a DRAM is used as an example memory device, the data storage material layer 93 may include a cell capacitor dielectric material of a DRAM. However, the example embodiment of the inventive concept is not limited to DRAMs, and may be used for various semiconductor devices. Accordingly, depending on characteristics of a device that the data storage material layer 93 requires, e.g., various data storage materials, such as a phase change material layer of a PRAM or a ferroelectric material layer of a FeRAM, may be used.

Meanwhile, while it is illustrated that the first electrode 90 is in the shape of a cylinder in FIG. 12A, the shape is not limited thereto, and may be embodied in different shapes depending on characteristics of a device. For example, the first electrode 90 may be formed in various shapes such as a pillar or a plate.

Next, referring to FIGS. 3, and 13A to 16B, a method of fabricating a semiconductor device according to another example embodiment of the inventive concept will be described below.

Figure 13A:
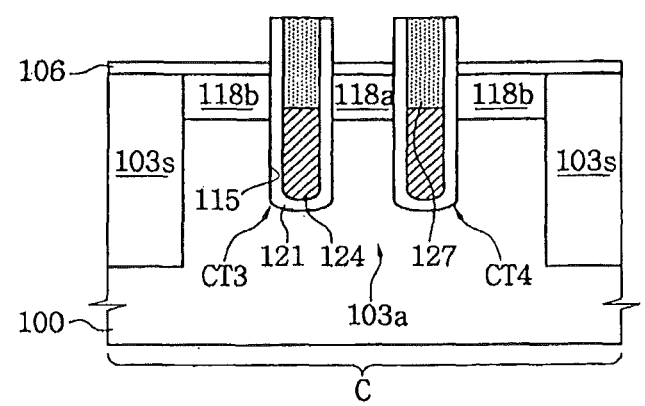
FIGS. 13A to 17B illustrate cross-sectional views of sequential stages in a method of fabricating a semiconductor device according to another example embodiment.
Figure 13B:
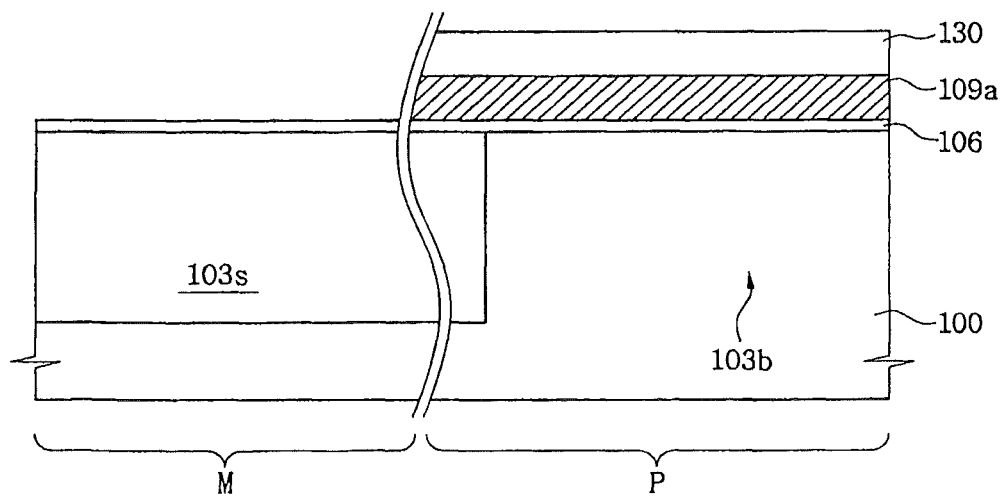

Referring to FIGS. 3, 13A and 13B, a semiconductor substrate 100 having the first region C, the second region P, and the intermediate region M may be prepared. First and second active regions 103a and 103b, an isolation region 103s, a dielectric layer 106, a gate conductive layer, a gate trench 115, cell impurity regions 118a and 118b, a cell gate dielectric layer 121, a cell gate pattern 124, a cell gate capping pattern 127, and cell transistors CT3 and CT4, which correspond to the first and second active regions 3a and 3b, an isolation region 3s, a dielectric layer 6, the gate conductive layer 9, the gate trench 15, the cell impurity regions 18a and 18b, the cell gate dielectric layer 21, the cell gate pattern 24, the cell gate capping pattern 27, and the cell transistors CT1 and CT2, respectively, may be formed using substantially the same method as those of FIGS. 4 and 5.

As illustrated in FIG. 13B, a mask pattern 130 may be formed on the gate conductive layer of the second region P, and the gate conductive layer may be etched to form a gate conductive pattern 109a remaining on the second region P. In the example embodiment of the inventive concept, the cell gate capping pattern 127 may remain to have a portion projecting from an upper surface of the first active region 103a while the gate conductive pattern 109a is formed. That is, the cell gate capping pattern 127 may remain to have a projection filling the cell gate pattern 124 and the gate trench 115, and an upper surface thereof may be disposed at a higher level along the y-axis than an upper surface of the first active region 103a. While the gate conductive pattern 109a is formed, at least a part of the dielectric layer 106 and the cell gate dielectric layer 121 may be etched.

In other example embodiments, an ion implantation process may be performed on the substrate 100 where the gate conductive pattern 109a is formed, so that impurity regions 118a and 118b may be formed in the first active region 103a.

Figure 14A:
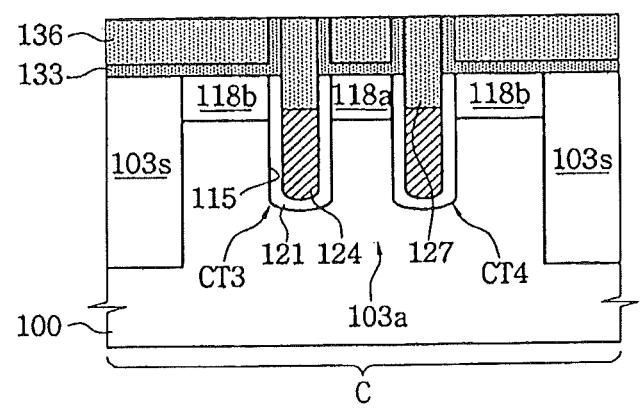
Figure 14B:
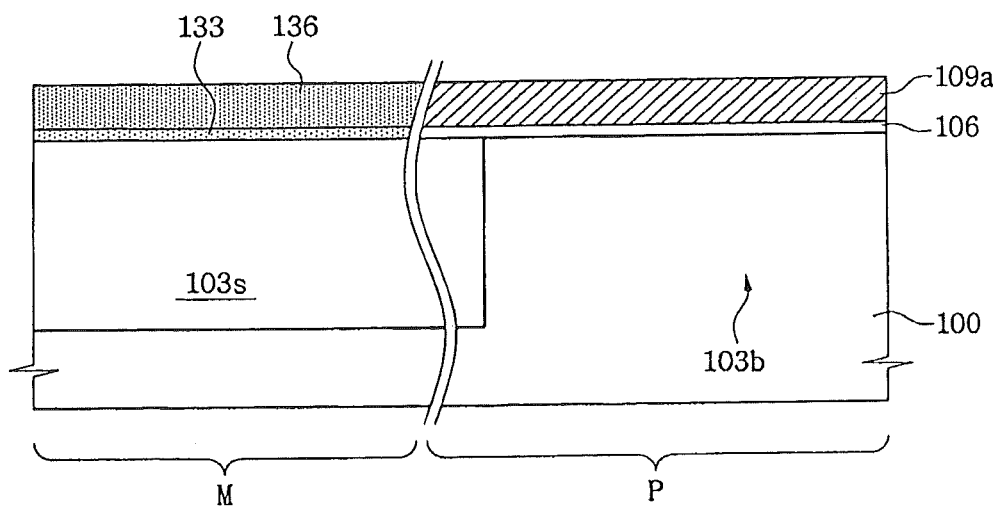

Referring to FIGS. 3, 14A and 14B, the mask pattern (130 of FIG. 13B) may be removed. Then, a stop layer 133 may be conformally formed on the resulting structure. A buffer insulating layer may be formed on the stop layer 133. The buffer insulating layer may be planarized until the stop layer 133 or the gate conductive pattern 109a on the second region P is exposed, so that a buffer insulating pattern 136 may be formed. When the stop layer 133 remains on the gate conductive pattern 109a while the buffer insulating pattern 136 is formed, the stop layer 133 on the gate conductive pattern 109a may be removed.

When the buffer insulating layer is planarized, e.g., using the CMP process, a projection of the cell gate capping pattern 127 on the first region C may function as a planarization stop layer. For example, when the cell gate capping pattern 127 is formed of a silicon nitride layer, and the buffer insulating layer is formed of a silicon oxide layer, the cell gate capping pattern 127 may be used as a planarization stop layer. Therefore, a dishing phenomenon in the first region C may be prevented while the planarization process is performed on the buffer insulating layer. Thus, the buffer insulating pattern 136 may have a planarized upper surface where the dishing phenomenon is significantly reduced.

Figure 15A:
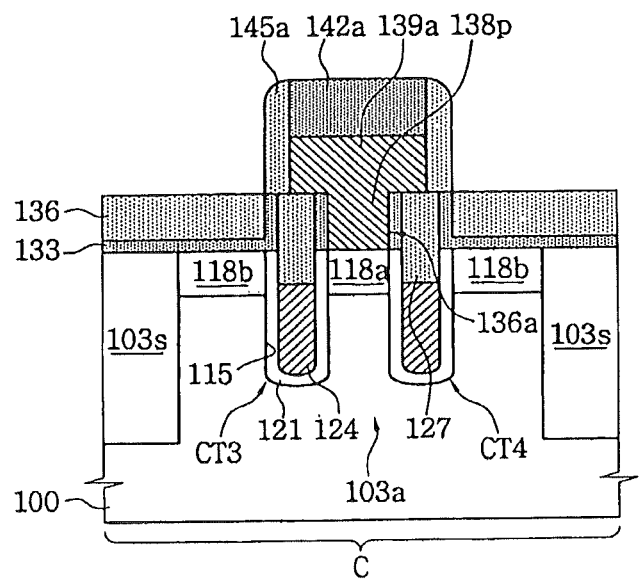
Figure 15B:
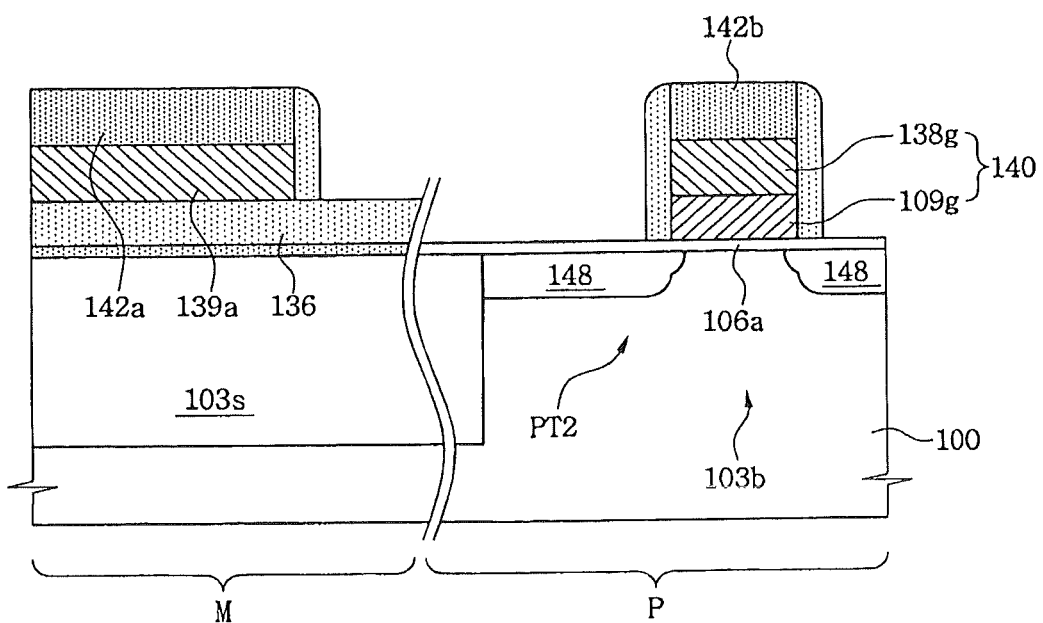

Referring to FIGS. 3, 15A and 15B, the buffer insulating pattern 136 and an insulating material under the buffer insulating pattern 136, e.g., the stop layer 133, on the first active region 103a of the first region C may be patterned to form a bit line contact hole 136a exposing the first cell impurity region 118a. A part of sidewalls of the bit line contact hole 136a may be defined by the projections of the cell gate capping patterns 127. Therefore, in order to form the bit line contact hole 136a, a photo process margin when a photoresist pattern is formed on the buffer insulating pattern 136 may be increased.

A first conductive layer may be formed on the entire surface of the semiconductor substrate having the buffer insulating pattern 136. The first conductive layer portion defined by the bit line contact hole 136a may be defined as a first contact structure 138p.

A bit line capping pattern 142a and a peripheral capping pattern 142b may be formed on the first conductive layer, and the first conductive layer and the gate conductive pattern (109a of FIGS. 14A and 14B) may be sequentially etched using the bit line capping pattern 142a and the peripheral gate capping pattern 142b as etch masks. As a result, a first conductive pattern, i.e., a cell bit line 139a, may be formed on the first region C and the intermediate region M, and a first peripheral gate electrode 109g and a second peripheral gate electrode 139g, which are sequentially stacked, may be formed on the second region P. The first and second peripheral gate electrodes 109g and 139g may constitute a peripheral gate pattern 140. Therefore, at least a part of the cell bit line 139a may be formed to be disposed at a substantially same level along the y-axis as at least a part of the peripheral gate pattern 140.

The cell bit line 139a may cover an upper portion of the bit line contact hole 136a. Therefore, the first contact structure 138a in the bit line contact hole 136a may be connected to the cell bit line 139a and may be formed of the same material. A peripheral gate dielectric layer 106a may be provided between the peripheral gate pattern 140 and the peripheral active region.

A bit line spacer 145a may be formed on sidewalls of the cell bit line 139a and the bit line capping pattern 142a. A peripheral gate spacer 145g may be formed on sidewalls of the peripheral gate pattern 140 and the peripheral gate capping pattern 142g.

Impurity ions may be implanted into the second active region 103b at both sides of the peripheral gate pattern 140 to be activated, so that peripheral impurity regions, i.e., peripheral source/drain regions 148, may be formed. Therefore, a peripheral transistor PT2 including the peripheral source/drain regions 148, the peripheral gate dielectric layer 106a, the peripheral gate pattern 140, and a channel region in the second active region 103b under the peripheral gate pattern 140, may be formed.

Referring to FIGS. 3, 16A and 16B, a first interlayer insulating layer 151 may be formed on the substrate having the peripheral transistor PT2. The first interlayer insulating layer 151 may be formed to have a planarized upper surface. For example, an insulating material layer may be formed on the substrate having the peripheral transistor PT2, and a planarization process may be performed on the insulating material layer, so that the first interlayer insulating layer 151 having a planarized upper surface may be formed. The planarization process may be performed using the CMP process employing the bit line capping pattern 142a and the peripheral gate capping pattern 142g as planarization stop layers.

In the first region C, cell contact holes 154a passing through the first interlayer insulating layer 151, the buffer insulating pattern 136, and the stop layer 133, and exposing the second cell impurity regions 118b may be formed. Cell contact structures 160a filling the cell contact holes 154a may be formed.

In the second region P, a peripheral contact hole 154b passing through the first interlayer insulating layer 151 and exposing at least one of the peripheral impurity regions 148 may be formed. A peripheral contact structure filling the peripheral contact hole 154b may be formed. The cell and peripheral contact holes 154a and 154b may be simultaneously formed. Also, the cell and peripheral contact structures 160a and 160b may be simultaneously formed. Therefore, the cell and peripheral contact structures 160a and 160b may be formed of the same conductive material.

Referring to FIGS. 3, 17A and 17B, in the intermediate region M, a connection via hole 161 passing through the bit line capping pattern 42s and exposing a predetermined region of the cell bit line 139a may be formed. A third conductive layer filling the connection via hole 161 may be formed, and the third conductive layer may be patterned, so that buffer patterns 175a covering the cell contact structures 160a, and a second conductive pattern 175b covering the connection via hole 161 and the peripheral contact structure 160b may be formed. The third conductive layer in the connection via hole 161 may be defined as a connection structure 175p. Accordingly, the second conductive pattern 175b may be connected to the cell bit line 139a through the connection structure 175p, and may be electrically connected to the peripheral transistor PT2, i.e., one of the peripheral impurity regions 148, through the peripheral contact structure 160b.

In another example embodiment of the inventive concept, the connection structure 175p and the peripheral contact structures 160a and 160b may be simultaneously formed.

In another example embodiment, the buffer patterns 175a and the second conductive pattern 175b may be formed using a damascene process. For example, a second interlayer insulating layer 184 may be formed on the substrate having the cell and peripheral contact structures 160a and 160b, and holes in a damascene structure for forming the buffer patterns 175a and the second conductive pattern 175b may be formed in the second interlayer insulating layer 184, a conductive material layer filling the holes may be formed, and the conductive material layer may be planarized, so that the buffer patterns 175a and the second conductive pattern 175b, which are defined in the holes, may be formed.

An etch stop layer 187 covering the buffer patterns 175a and the second conductive pattern 175b may be formed. Then, data storage elements 197 electrically connected to the buffer patterns 175a may be formed on the buffer patterns 175a. The data storage elements 197 may be used as a data storage unit of a volatile or non-volatile memory device.

Next, still another example embodiment of the inventive concept will be described below with reference to FIGS. 18A, 18B and 19.

Referring to FIGS. 3, 18A, and 18B, a semiconductor substrate 200 having the first region C, the second region P and the intermediate region M may be prepared as illustrated in FIGS. 4A and 4B. An isolation region 203s defining active regions 203a and 203b may be provided in the semiconductor substrate 200 using the same method as that of FIGS. 4A and 4B. A preliminary impurity region may be formed in the first active region 203a.

A stop layer 206 and a buffer insulating layer 209, which are sequentially stacked, may be formed on the semiconductor substrate 200. The stop layer 206 may include a material layer having an etch selectivity with respect to the isolation region 203s. The buffer insulating layer 209 may be formed of a single layer formed of an insulating material. Alternatively, the buffer insulating layer 209 may be a multilayer having different etch selectivities, i.e., different material layers. For example, the buffer insulating layer 209 may be formed of a first material layer, e.g., as a silicon oxide layer, and a second material layer, e.g., a polysilicon layer or a silicon nitride layer. The second material layer may be formed on the first material layer.

The buffer insulating layer 209 on the semiconductor substrate of the first region C may be patterned, so that an opening exposing predetermined regions of the first active region 203a and the isolation region 203s may be formed. Further, the first active region 203a and the isolation region 203s, which are exposed by the opening, may be etched, so that a gate trench 215 illustrated in FIG. 18A may be formed. The preliminary impurity region may be divided by the gate trench 215 to form first and second impurity regions 218a and 218b.

A cell gate dielectric layer 221 and a cell gate pattern 224 may be sequentially formed in the cell gate trench 215 using the same method as FIG. 5A. Therefore, cell transistors CT5 and CT6 may be formed in the first active region 203a.

A cell gate capping pattern 227 filling the remaining portion of the cell gate trench 215 and having a portion projecting from the upper surface of the first active region 203a may be formed. The cell gate capping pattern 227 may be formed to include at least one of a silicon oxide layer, a silicon nitride layer and a silicon oxynitride layer.

Meanwhile, when the buffer insulating layer 209 includes a first material layer and a second material layer, which are sequentially stacked, the second material layer may be removed while the cell gate capping pattern 227 is formed or after the cell gate capping pattern 227 is formed.

Referring to FIGS. 3 and 19, the buffer insulating layer 209 and the stop layer 206 may be patterned to expose the second active region 203 of the second region P, and to form a buffer insulating pattern 209a remaining on the first region P and the intermediate region M. Afterwards, a gate dielectric layer 210 and a gate conductive pattern 211, which are sequentially stacked, may be formed on the substrate of the second region P.

The gate dielectric layer 210 and the gate conductive pattern 211 may respectively correspond to the gate dielectric layer 6 and 106 of FIGS. 6B and 14B and a gate conductive pattern 9a and 109a, which are sequentially stacked on the second active region 3b and 103b of FIGS. 6B and 14B. While a method of forming the buffer insulating pattern 209a, the gate dielectric layer 210 and the gate conductive pattern 211 of FIG. 19 may be different from a method of forming the buffer insulating pattern 36 and 136, the dielectric layer 6 and 106 and the gate conductive pattern 9a and 109a of FIGS. 6B and 14B, the resultant structures are similar. Therefore, the previously described elements such as the first conductive pattern 39a and 139a, the second conductive pattern 175b, and the data storage element 97 and 197 may be formed on the semiconductor substrate having the buffer insulating pattern 209a, the gate dielectric layer 210 and the gate conductive pattern 211.

Figure 20:
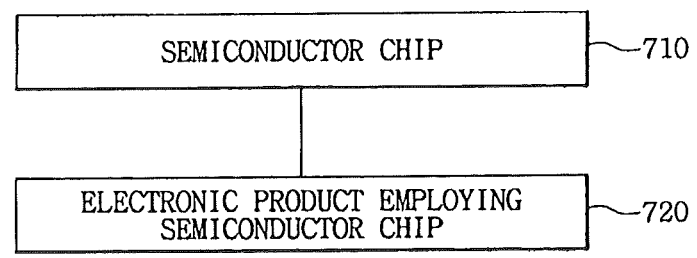
FIG. 20 illustrates a schematic diagram of a semiconductor chip and an electronic product according to example embodiments.

FIG. 20 schematically illustrates products employing a semiconductor device according to example embodiments of the inventive concept. Referring to FIG. 20, a semiconductor chip 710 employing the semiconductor device according to the previously described example embodiments may be provided. For example, an integrated circuit and a data storage unit may be formed on a semiconductor wafer in a bulk state having a plurality of chip regions using the method according to the previously described example embodiments. As described above, the semiconductor wafer where the integrated circuit and the data storage unit are formed may be divided, e.g., along the y-axis, to form a plurality of semiconductor chips 710. The semiconductor chip 710 may be formed in a package. The semiconductor chip 710 may be adapted for electronic products. The semiconductor chip 710 may function as a data storage medium. For example, the semiconductor chip 710 may be used as parts of an electronic product 720, which requires a data storage medium, such as a digital TV, a computer, a communication device, an electronic dictionary, or a portable memory device. For example, a packaged semiconductor chip 710 may be installed on a board or a memory module to be adapted as a part constituting the electronic product.

According to example embodiments of the inventive concept, while a first gate electrode and a second gate electrode are sequentially stacked on a peripheral circuit region, an interconnection such as a cell bit line may be formed on a cell array region. Therefore, the interconnection may be disposed substantially at the same level, i.e., height along the y-axis above the upper surface of the substrate, as the second gate electrode of the peripheral circuit region. As a result, the overall thickness of the device may be reduced.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate having a cell region and a peripheral region;
   a cell transistor including a cell gate electrode in a gate trench in the semiconductor substrate and first and second cell source/drain regions in the cell region;
   a peripheral transistor including a peripheral gate electrode and first and second peripheral source/drain regions in the peripheral region;
   a bit line conductive pattern electrically coupled to the first cell source/drain region;
   a bit line insulating capping pattern disposed on the bit line conductive pattern;
   a cell contact structure on the second cell source/drain region;
   a first conductive pattern on the cell contact structure; and
   a second conductive pattern electrically coupled to the bit line conductive pattern and the peripheral transistor,
   wherein an upper surface of the first conductive pattern is disposed at substantially a same height above an upper surface of the bit line insulating capping pattern as an upper surface of the second conductive pattern.

2. The semiconductor device of claim 1, wherein the first conductive pattern and the second conductive pattern are in contact with an upper surface of the bit line insulating capping pattern.

3. The semiconductor device of claim 1, further comprising:
   a connection structure between the second conductive pattern and the bit line conductive pattern, wherein the connection structure electrically coupled between the bit line conductive pattern and the second conductive pattern through the bit line insulting capping pattern.

4. The semiconductor device of claim 3, further comprising:
   an isolation region defining an active region, wherein the connection structure and the isolation region overlap in a direction perpendicular with respect to a surface of the semiconductor substrate.

5. The semiconductor device of claim 1, wherein an upper surface of the bit line conductive pattern is disposed at substantially a same height above an upper surface of the semiconductor substrate as an upper surface of the peripheral gate electrode.

6. The semiconductor device of claim 1, wherein the second conductive pattern is electrically coupled to the first peripheral source/drain region of the peripheral transistor.

7. The semiconductor device of claim 1, further comprising:
   an insulating buffer layer on the cell region, wherein the insulating buffer layer is between the bit line conductive pattern and the semiconductor substrate.

8. The semiconductor device of claim 7, further comprising:
   a bit line contact structure electrically coupled between the bit line conductive pattern and the first cell source/drain region through the insulating buffer layer.

9. The semiconductor device of claim 1, further comprising:
   a cell gate capping pattern on the cell gate electrode, wherein an upper surface of the cell gate capping pattern is higher than an upper surface of the semiconductor substrate.

10. The semiconductor device of claim 1, wherein a portion of the first conductive pattern overlaps the bit line insulating capping pattern.

11. The semiconductor device of claim 1, further comprising:
    a peripheral contact structure disposed between the second conductive pattern and the first peripheral source/drain region, wherein the peripheral contact structure is electrically coupled between the second conductive pattern and the first peripheral source/drain region.

12. A semiconductor device comprising:
    a semiconductor substrate having a cell region and a peripheral region, the semiconductor substrate including an isolation region defining a cell active region in the cell region and a peripheral active region in the peripheral region;
    a cell transistor in the cell region, wherein the cell transistor includes a cell gate electrode in a gate trench in the semiconductor substrate and first and second cell source/drain regions on opposite sides of the gate trench;
    a peripheral transistor in the peripheral region, wherein the peripheral transistor includes a peripheral gate electrode on the peripheral active region and first and second peripheral source/drain regions in the peripheral active region adjacent opposite sides of the peripheral gate electrode;
    a bit line conductive pattern electrically coupled to the first cell source/drain region;
    a bit line insulating capping pattern on the bit line conductive pattern;
    a first conductive pattern electrically coupled to the second cell source/drain region; and
    a second conductive pattern electrically coupled to the bit line conductive pattern and the first peripheral source/drain region,
    wherein portions of the first conductive pattern and the second conductive pattern are disposed on the bit line insulating capping pattern.

13. The semiconductor device of claim 12, further comprising:
    a connection structure between the second conductive pattern and the bit line conductive pattern, wherein the connection structure is electrically coupled between the bit line conductive pattern and the second conductive pattern through the bit line insulting capping pattern.

14. The semiconductor device of claim 13, wherein the connection structure and the isolation region overlap in a direction perpendicular with respect to a surface of the semiconductor substrate.

15. The semiconductor device of claim 13, further comprising:
   a peripheral contact structure between the second conductive pattern and the first peripheral source/drain region, wherein the peripheral contact structure is electrically coupled between the second conductive pattern and the first peripheral source/drain region.

16. The semiconductor device of claim 12, further comprising:
   a cell contact structure between the first conductive pattern and the second cell source/drain region, wherein the cell contact structure is electrically coupled between the first conductive pattern and the second cell source/drain region.

17. The semiconductor device of claim 12, wherein an upper surface of the first conductive pattern is disposed at substantially a same height above an upper surface of the bit line insulating capping pattern as an upper surface of the second conductive pattern.

18. The semiconductor device of claim 12, wherein an upper surface of the bit line conductive pattern is disposed at substantially a same height above an upper surface of the semiconductor substrate as an upper surface of the peripheral gate electrode.

19. The semiconductor device of claim 12, wherein the peripheral gate electrode includes a first peripheral gate electrode pattern and a second peripheral gate electrode pattern,
   wherein the bit line conductive pattern and the second peripheral gate electrode pattern comprise a same material and have a same thickness in a direction perpendicular with respect to a surface of the semiconductor substrate.

20. The semiconductor device of claim 12, wherein the first conductive pattern and the second conductive pattern are in contact with the bit line insulating capping pattern.

* * * * *